US012600904B2

(12) United States Patent
Koch et al.

(10) Patent No.: US 12,600,904 B2
(45) Date of Patent: \*Apr. 14, 2026

(54) CIRCULARLY POLARIZED LIGHT EMITTING ORGANIC LIGHT EMITTING DIODES

(71) Applicant: RED BANK TECHNOLOGIES LLC, Red Bank, NJ (US)

(72) Inventors: Gene C. Koch, Corvallis, OR (US); John N. Magno, Newtown, PA (US)

(73) Assignee: Red Bank Technologies LLC, Red Bank, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/171,563

(22) Filed: Feb. 20, 2023

(65) Prior Publication Data

US 2023/0209888 A1 Jun. 29, 2023

Related U.S. Application Data

(63) Continuation of application No. 16/486,307, filed as application No. PCT/US2018/018737 on Feb. 20, 2018, now Pat. No. 11,588,139.

(Continued)

(51) Int. Cl.
*C09K 11/06* (2006.01)
*G02B 3/14* (2006.01)
(Continued)

(52) U.S. Cl.
CPC ............... *C09K 11/06* (2013.01); *G02B 3/14* (2013.01); *G02B 26/005* (2013.01); *H10K 50/11* (2023.02);
(Continued)

(58) Field of Classification Search
CPC ..... H01L 51/5293; G02B 3/14; G02B 26/005; C09K 11/06; H10K 50/11; H10K 50/155
See application file for complete search history.

(56) References Cited

U.S. PATENT DOCUMENTS 7,118,787 B2 10/2006 O'Neill et al.
9,013,793 B2 4/2015 Gupta et al.
(Continued)

FOREIGN PATENT DOCUMENTS

EP 1166157 B1 1/2002
WO 2016209797 A1 12/2016
WO 2017156433 A1 9/2017

OTHER PUBLICATIONS

International Search Report and Written Opinion of corresponding International Application No. PCT/US18/18737, dated May 3, 2018.

(Continued)

*Primary Examiner* — Ratisha Mehta
(74) *Attorney, Agent, or Firm* — Kolisch Hartwell, P.C.

(57) ABSTRACT

Disclosed herein are light emitting device that emit highly circularly polarized light. These devices may be used to form a dot-matrix display or an electronic information display comprised of a series of photopolymerizable, chiral liquid crystalline layers that can be solvent cast on a substrate. The mixture of chiral materials in each successive layer may be blended in such a way that each layer has the same chiral pitch and may also be blended so that the ordinary and extraordinary refractive indices in each layer match the other layers such that the complete assembly of layers will optically function as a single relatively thick layer or chiral liquid crystal. The chiral nematic material in each layer can spontaneously adopt a helical structure with a helical pitch. Further disclosed are pixel structures that not (Continued)

only emit light with brightness and chromaticity information, but also depth of focus information as well.

20 Claims, 23 Drawing Sheets

Related U.S. Application Data

(60) Provisional application No. 62/460,170, filed on Feb. 17, 2017.

(51) Int. Cl.

| | |
|---|---|
| *G02B 26/00* | (2006.01) |
| *H10K 50/11* | (2023.01) |
| *H10K 50/15* | (2023.01) |
| *H10K 50/155* | (2023.01) |
| *H10K 50/16* | (2023.01) |
| *H10K 50/165* | (2023.01) |
| *H10K 59/35* | (2023.01) |
| *H10K 59/38* | (2023.01) |
| *H10K 59/50* | (2023.01) |
| *H10K 59/80* | (2023.01) |
| *H10K 85/00* | (2023.01) |
| *H10K 85/10* | (2023.01) |
| *H10K 85/30* | (2023.01) |
| *H10K 85/60* | (2023.01) |
| *H10K 101/10* | (2023.01) |

(52) U.S. Cl.
CPC ......... *H10K 50/155* (2023.02); *H10K 50/156* (2023.02); *H10K 50/165* (2023.02); *H10K 50/166* (2023.02); *H10K 59/35* (2023.02); *H10K 59/38* (2023.02); *H10K 59/50* (2023.02); *H10K 59/878* (2023.02); *H10K 59/879* (2023.02); *H10K 59/8793* (2023.02); *H10K 59/8791* (2023.02); *H10K 85/111* (2023.02); *H10K 85/141* (2023.02); *H10K 85/151* (2023.02); *H10K 85/342* (2023.02); *H10K 85/6572* (2023.02); *H10K 85/731* (2023.02); *H10K 2101/10* (2023.02)

(56) References Cited

U.S. PATENT DOCUMENTS

| | | | |
|---|---|---|---|
| 9,250,444 | B2 | 2/2016 | Magyari |
| 11,506,893 | B2 | 11/2022 | Koch et al. |

| | | | | |
|---|---|---|---|---|
| 2004/0069995 | A1* | 4/2004 | Magno | H10K 50/852 |
| | | | | 257/E33.068 |
| 2004/0195962 | A1 | 10/2004 | Nakamura et al. | |
| 2004/0212603 | A1 | 10/2004 | Cok | |
| 2005/0194896 | A1 | 9/2005 | Sugita et al. | |
| 2005/0253112 | A1* | 11/2005 | Kelly | C09K 19/3497 |
| | | | | 252/301.16 |
| 2006/0061563 | A1 | 3/2006 | Fleck | |
| 2006/0158096 | A1 | 7/2006 | Adachi et al. | |
| 2006/0181202 | A1* | 8/2006 | Liao | H10K 50/155 |
| | | | | 313/504 |
| 2006/0226396 | A1 | 10/2006 | Majumdar et al. | |
| 2006/0280100 | A1 | 12/2006 | Ooi et al. | |
| 2007/0179200 | A1 | 8/2007 | Liogier D'Ardhuy et al. | |
| 2007/0217022 | A1 | 9/2007 | Kuiper et al. | |
| 2009/0009072 | A1* | 1/2009 | Wellmann | H10K 50/155 |
| | | | | 313/504 |
| 2009/0027591 | A1* | 1/2009 | Hwang | G02F 1/1336 |
| | | | | 349/64 |
| 2009/0242911 | A1* | 10/2009 | Ishihara | H10K 50/19 |
| | | | | 257/89 |
| 2010/0009661 | A1 | 1/2010 | Zhu | |
| 2010/0096617 | A1 | 4/2010 | Shanks | |
| 2011/0020566 | A1 | 1/2011 | Koch | |
| 2011/0164221 | A1 | 7/2011 | Tilleman et al. | |
| 2011/0216308 | A1* | 9/2011 | Tezuka | G01N 21/49 |
| | | | | 356/445 |
| 2013/0021673 | A1 | 1/2013 | Huang et al. | |
| 2013/0320307 | A1* | 12/2013 | Birnstock | H10K 50/165 |
| | | | | 257/40 |
| 2014/0160398 | A1 | 6/2014 | Yoon et al. | |
| 2015/0205351 | A1 | 7/2015 | Osterhout et al. | |
| 2015/0346495 | A1* | 12/2015 | Welch | G02B 27/017 |
| | | | | 345/8 |
| 2017/0005235 | A1 | 1/2017 | Chou et al. | |
| 2017/0090194 | A1 | 3/2017 | Hayes | |
| 2017/0331003 | A1* | 11/2017 | Cheng | H10H 20/852 |
| 2018/0007351 | A1* | 1/2018 | Zhao | G02B 30/28 |
| 2018/0024366 | A1 | 1/2018 | Ma et al. | |
| 2019/0157572 | A1 | 5/2019 | Koch et al. | |
| 2023/0341686 | A1 | 10/2023 | Koch et al. | |

OTHER PUBLICATIONS

Paschotta, Dr. Rüdiger, "Conflicting Definitions of S and P Polarization", RP Photonics Encyclopedia, Mar. 3, 2012, 3 pages.

* cited by examiner

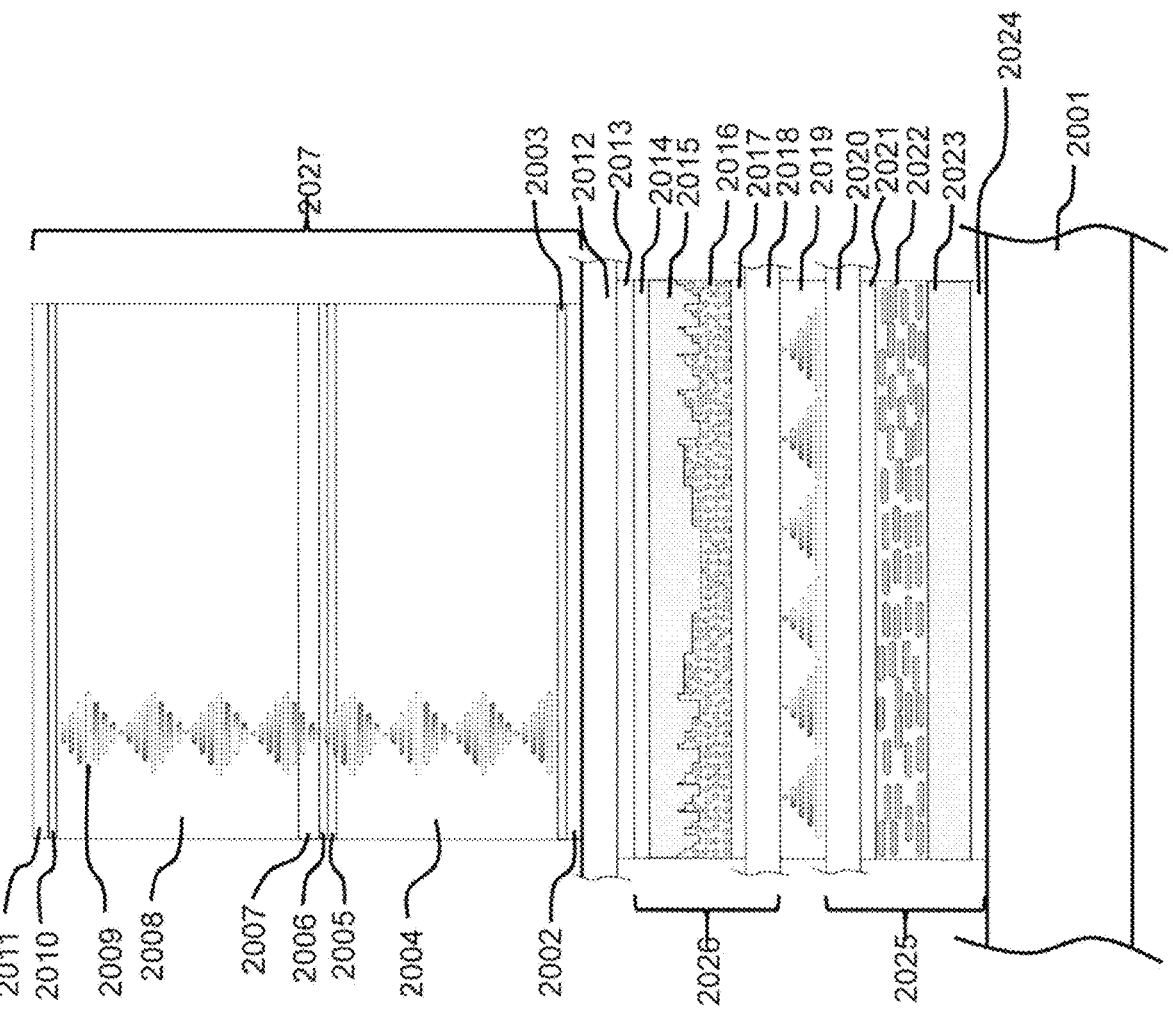
Figure 20
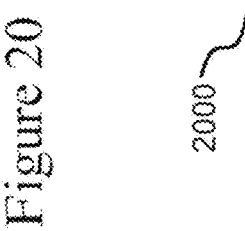

2110

2100

CIRCULARLY POLARIZED LIGHT EMITTING ORGANIC LIGHT EMITTING DIODES

CROSS-REFERENCE TO RELATED APPLICATION

This application is continuation of U.S. patent application Ser. No. 16/486,307, filed Feb. 20, 2018, which is a 371 National Stage of International Application No. PCT/US2018/18737, filed Feb. 20, 2018, which was published as International Publication No. WO 2018/152506, and which claims the benefit under 35 U.S.C. § 119(e) of the earlier filing date of U.S. Provisional Patent Application No. 62/460,170 filed on Feb. 17, 2017. The disclosure of each of these applications is incorporated by reference herein.

BACKGROUND

Currently pending International Patent Application No. PCT/US2017/21867 filed on Mar. 10, 2017 describes organic light emitting diode (OLED) devices in which the organic emitter and charge transporting layers combine to form a chiral liquid crystalline assembly with a uniform chiral pitch. The rationale for creating such a structure in an OLED device is that the chiral structure acts as a photonic crystal for one of the circular polarizations of light produced by the OLED emitter. The presence of the photonic crystal structure results in the formation of band edge light emission modes and, in turn, the light emitted into these modes is trapped in the photonic crystal structure. The presence of this trapped light stimulates further light emission with the result that nearly all the light emitted is produced by stimulated emission into the band edge modes. This light is emitted almost totally in the vertical direction with the result that the OLED with this structure is an extremely energy efficient emitter of light. It is a requirement for the functioning of these devices that the wavelengths of the band edge emission modes overlap wavelengths near the center of the emission band of the OLED emitter material. While the rationale for devices of this type is that the chiral liquid crystalline structure yields devices with very high energy efficiency, a second feature of these devices is that they produce highly circularly polarized light.

In U.S. patent application Ser. No. 10/519,761 Kelly and O'Neill point out that an organic circularly polarized light emitting diode (OCPLED) would be very useful for backlighting liquid crystal displays (LCDs) because the circularly polarized light they emit could be easily converted into plane polarized light utilizing a retarder sheet. This plane polarized light could then be used to backlight the LCD eliminating the need for a rear polarizer and considerably increasing the energy efficiency of the LCD. U.S. application Ser. No. 10/519,761 further describes how such a device might be fabricated using chiral calamitic (nematic or smectic) liquid crystals. The patent application describes devices in which a chiral calamitic liquid crystal is coated on to a substrate surface such that it is uniformly aligned with its molecular long axes oriented parallel to the surface. This results in an OLED with an helical structure similar to that described in International Patent Application No. PCT/US2017/21867. Application Ser. No. 10/519,761 further teaches that the light emission band of the chiral OLED emitter material must be centered in the reflection or stop band of the helical structure. International Patent Application No. PCT/US2017/21867 also teaches that the thickness of the layer of chiral liquid crystalline organic light emitting material be between one and ten microns in thickness. This application is mute on any further requirements for practical working device.

An issue with the devices disclosed in International Patent Application No. PCT/US2017/21867 is that there is a tradeoff between the degree of light polarization and achieved and the voltage difference applied across the device. In devices of this type a minimum thickness of two microns and generally more is required to establish a fully formed reflection band in the wavelength transmission spectrum of the chiral structure. This means that thicknesses of less than two microns in thickness will allow some light with the unwanted circular polarization as well as that with the required circular polarization to be emitted from the OLED. A further issue is that the reflection band of the chiral structure will be spectrally narrower and this, in turn, will result in a narrower range of emission angles in which light is reasonably well polarized. This also means that the spectral emission band of the emitter material will be required to be narrower so as not extend outside of the reflection band.

Increasing the thickness of the layer of chiral emitter material will allow the reflection or stop band to be fully formed and extend over a wider band of wavelengths, the exact spectral width depending also on the difference between the ordinary and extraordinary refractive indices of the chiral liquid crystal (that is to say its birefringence). The problem is that the thicker the layers of organic emitter material are, the more the drive voltage of the device must be increased to produce the same amount of light emission due to the low charge carrier mobilities of the organic materials. For this reason the sum of the thicknesses of the organic layers in a conventional OLED is on the order of 100 nm.

In U.S. patent application Ser. No. 14/726,429, Welch et al. describe a system for presenting stereoscopic images to the eyes of an observer through displays mounted on the observers head. This system comprises light valves and variable focus elements. The variable focus elements (VFEs) are used to adjust the apparent distance from the observer of the imagery displayed on the light valves. In one of the simpler embodiments of this invention, each frame of video information displayed on a light valve is transmitted to the observer through a VFE set at a particular focal distance. In this case all of the objects in a scene displayed on the light valve will appear to the observer at the same depth of focus. This can result in conflict between the apparent distance of an object in a displayed scene based on the different left eye and right eye points of view displayed in a stereo pair of images presented in a binocular display and the object's apparent distance based on the accommodation of the observer's eyes as they attempt to focus on the object. These sorts of conflicts can, in extreme cases, result in nausea and more often result in fatigue after viewing video from such a display system over a period of time. Because of this issue, more complex embodiments are described in U.S. application Ser. No. 14/726,429 in which individual video frames are sub-divided into multiple sub-frames each of which shows objects at a particular distance in the scene with the depth of focus provided by the VFE adjusted to that particular distance. Each of these sub-frames are then displayed sequentially in time within the time allotted for one frame in the, for instance, sixty hertz frame rate of the video presentation. Of course, this approach is limited by the switching speed of the display and the VFE as well as the ability of the video processing hardware/ software to break the displayed scene up into sub-frames based on distance from the viewer.

A potentially more desirable stereoscopic display system would be one that utilizes displays in which each pixel displays not only brightness and color, but also depth of focus information as well.

BRIEF DESCRIPTION OF THE DRAWINGS

FIG. 2 illustrates the molecular structure for an exemplary prepolymerized and solvent cast hole transporting liquid crystal photoalignment material.

FIG. 3 illustrates the molecular structure for an exemplary copolymer of a monomeric hole transporting material.

FIG. 5 illustrates the molecular structure of a strongly electron accepting monomeric p-dopant.

FIG. 6 illustrates molecular structures for monomeric hole transporting liquid crystalline materials.

FIG. 7 illustrates general molecular structures for exemplary chiral dopants.

FIG. 8 illustrates the molecular structure for an electroluminescent nematic material.

FIG. 9 illustrates general molecular structures for green light emitting phosphorescent heteroleptic phosphorescent iridium organometallic dopants.

FIG. 10 illustrates general molecular structures for examples of monomeric hole transporting host materials.

FIG. 11 illustrates general molecular structures for examples of monomeric hole transporting host materials.

FIG. 12 illustrates molecular structures of monomeric nematic materials and a chiral dopant for fabricating electron transporting layers.

FIG. 15 illustrates an alternative device structure that yields a transparent OLED.

FIG. 20 illustrates a device that may be used as a sub-pixel in a display in which each pixel emits light with not only with selected brightness and color, but also with apparent depth of focus information.

FIG. 21b illustrates a liquid crystal molecular alignment scheme in which the molecules at one substrate have an alignment that is rotated 180 degrees from the scheme illustrated in FIG. 21a.

DETAILED DESCRIPTION OF THE INVENTION

Figure 1:
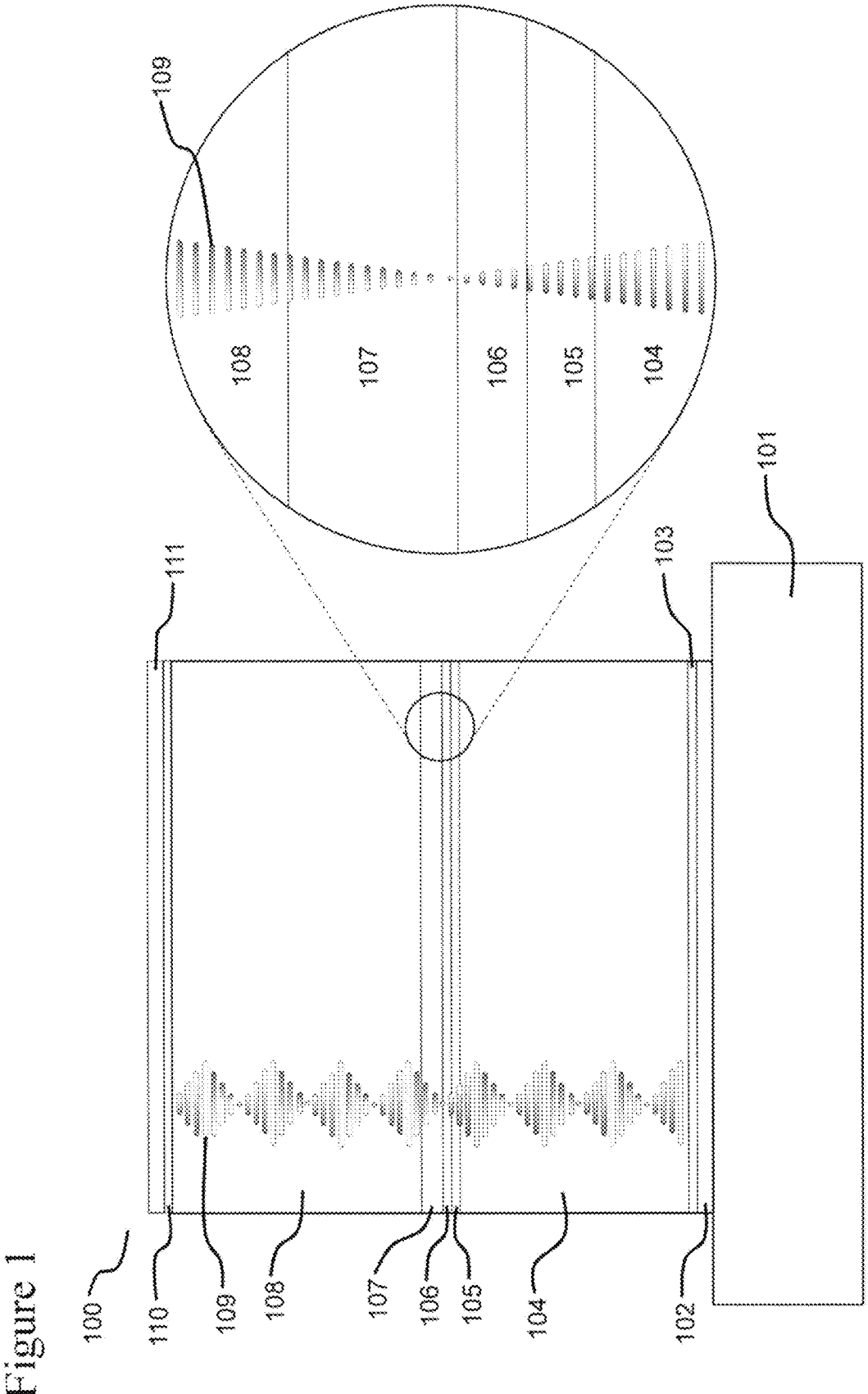
FIG. 1 illustrates the structure for a chiral OLED device.
Figure 2:
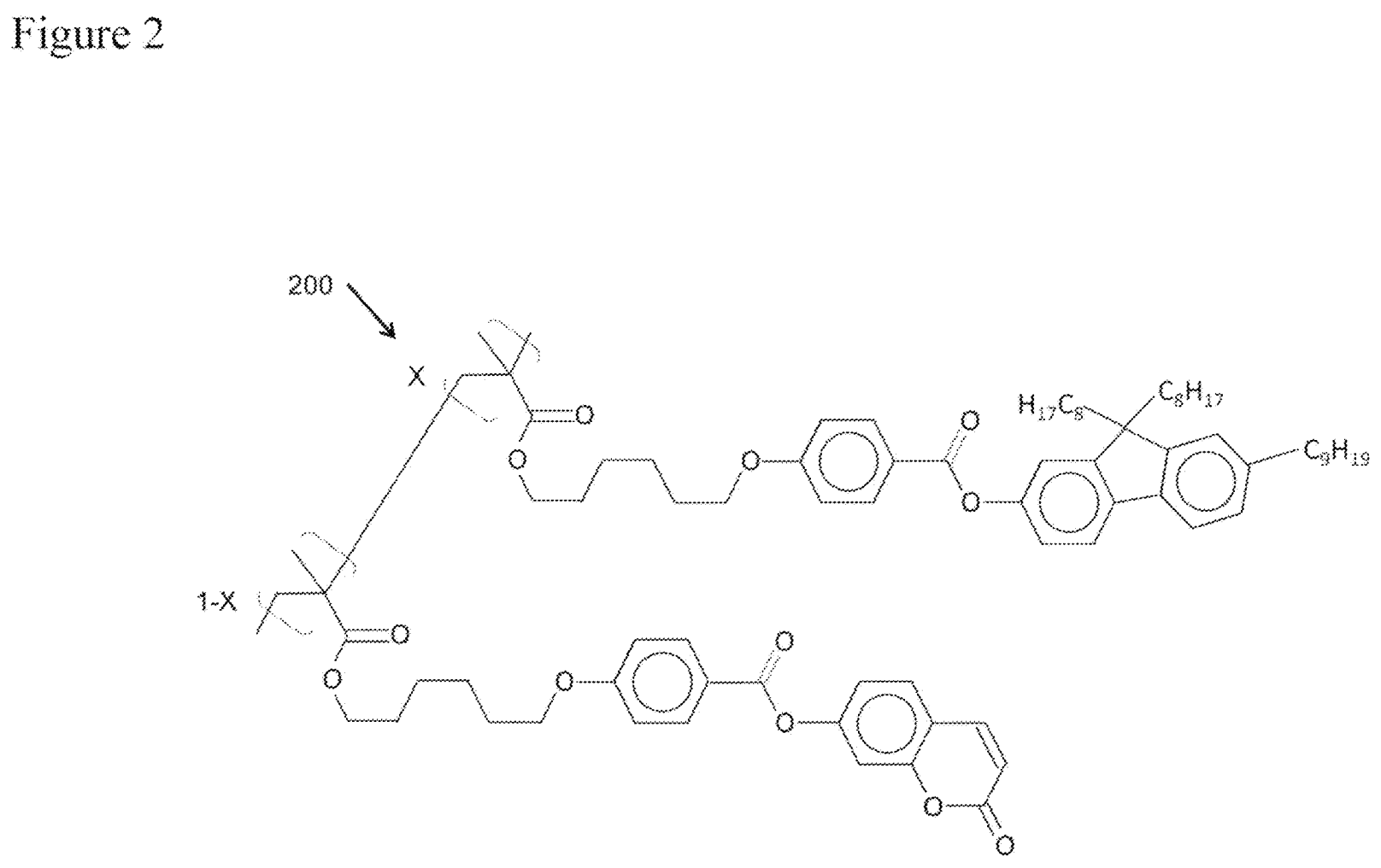
Figure 3:
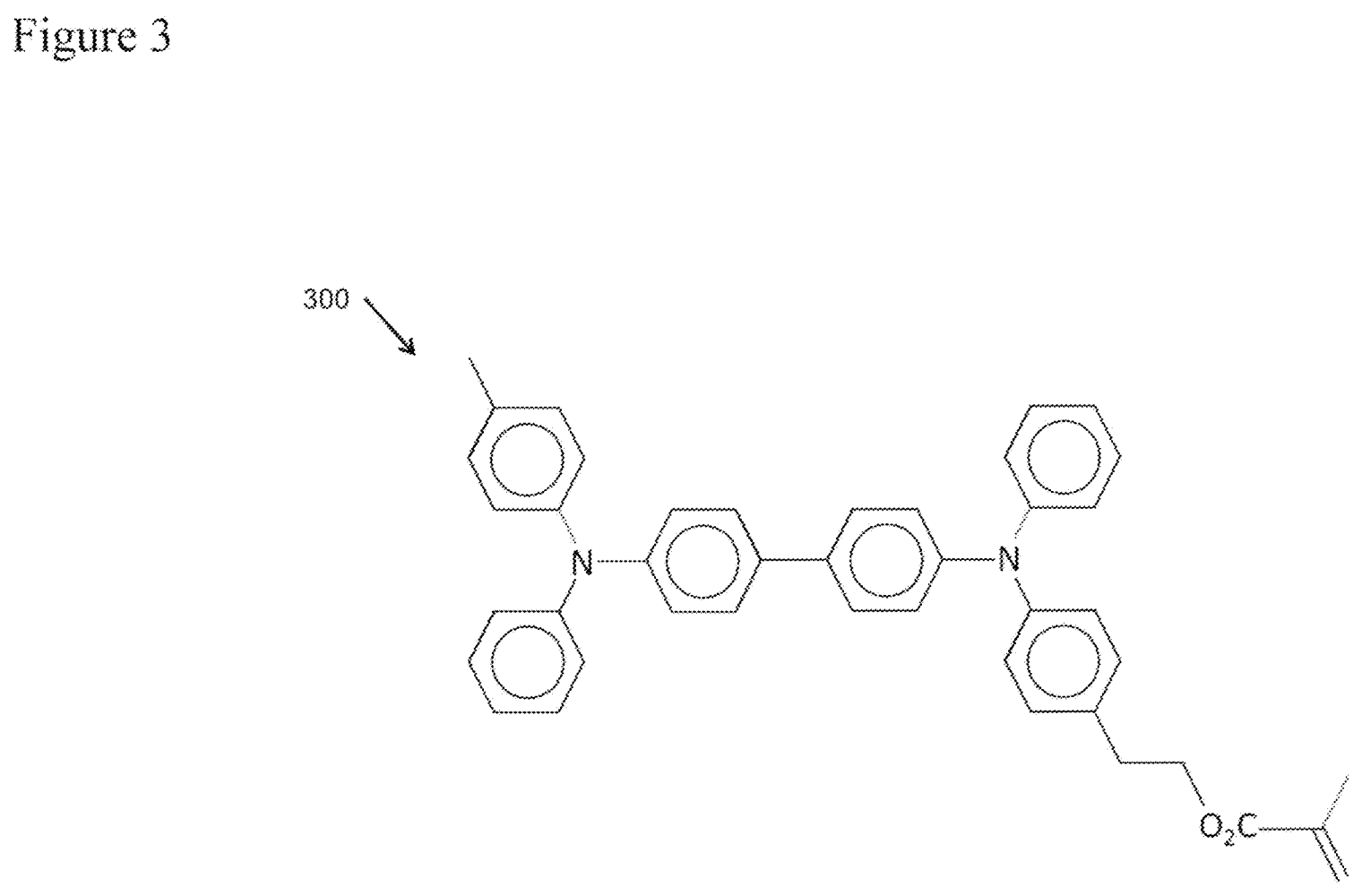
Figure 4:
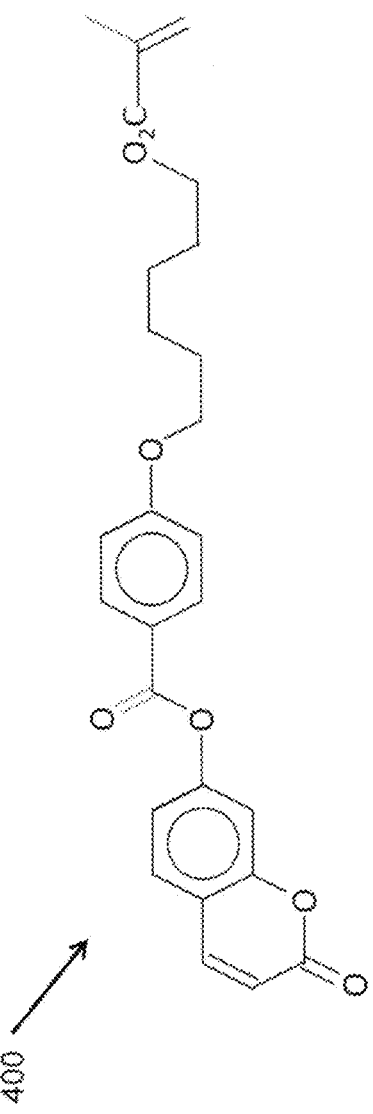
FIG. 4 illustrates the molecular structure for a monomeric liquid crystal photoalignment material.

We have now found that a structure similar to that previously described in International Patent Application No. PCT/US2017/21867 may be used to produce a device that functions like those described in application Ser. No. 10/519,761. This device structure 100 is illustrated in FIG. 1. The device is built up layer by layer on a transparent substrate 101 composed of any suitable materials, for instance glass or clear plastic. First a clear, electrically conducting anode layer 102 is coated onto the substrate, most often by vacuum deposition. This anode layer may comprise a transparent semiconducting material such as indium zinc oxide or indium-tin oxide. Next a hole transporting, liquid crystal photoalignment layer 103 is coated onto the substrate surface. U.S. Pat. No. 7,118,787 and US Patent Application 2011/0020566 disclose various materials that can be used as such a hole transporting layer in various embodiments of a chiral liquid crystalline light emitting device. For example, an exemplary prepolymerized and solvent cast hole transporting liquid crystal photoalignment material 200, is shown in FIG. 2. Alternatively an exemplary photopolymerized copolymer of a monomeric hole transporting material 300 (illustrated in FIG. 3) and a monomeric liquid crystal photoalignment material 400 (illustrated in FIG. 4) may be used to form layer 103. In this case, layers are produced by solvent casting a mixture of the two monomers onto the surface of the anode layer and photopolymerizing them in place. Liquid crystal photoalignment layers of this type are produced by first forming the layer as described above and then exposing it to polarized UV light (e.g. at a wavelength of 325 nm). This polymerizes the double bonds in the coumarin functional units aligned along one axis in the in the molecules of the layer, but not along the perpendicular axis in the plane of the layer. This, in turn, produces an anisotropic surface energy at the surface of the alignment layer that aligns liquid crystal molecules coated over it.

Figure 5:
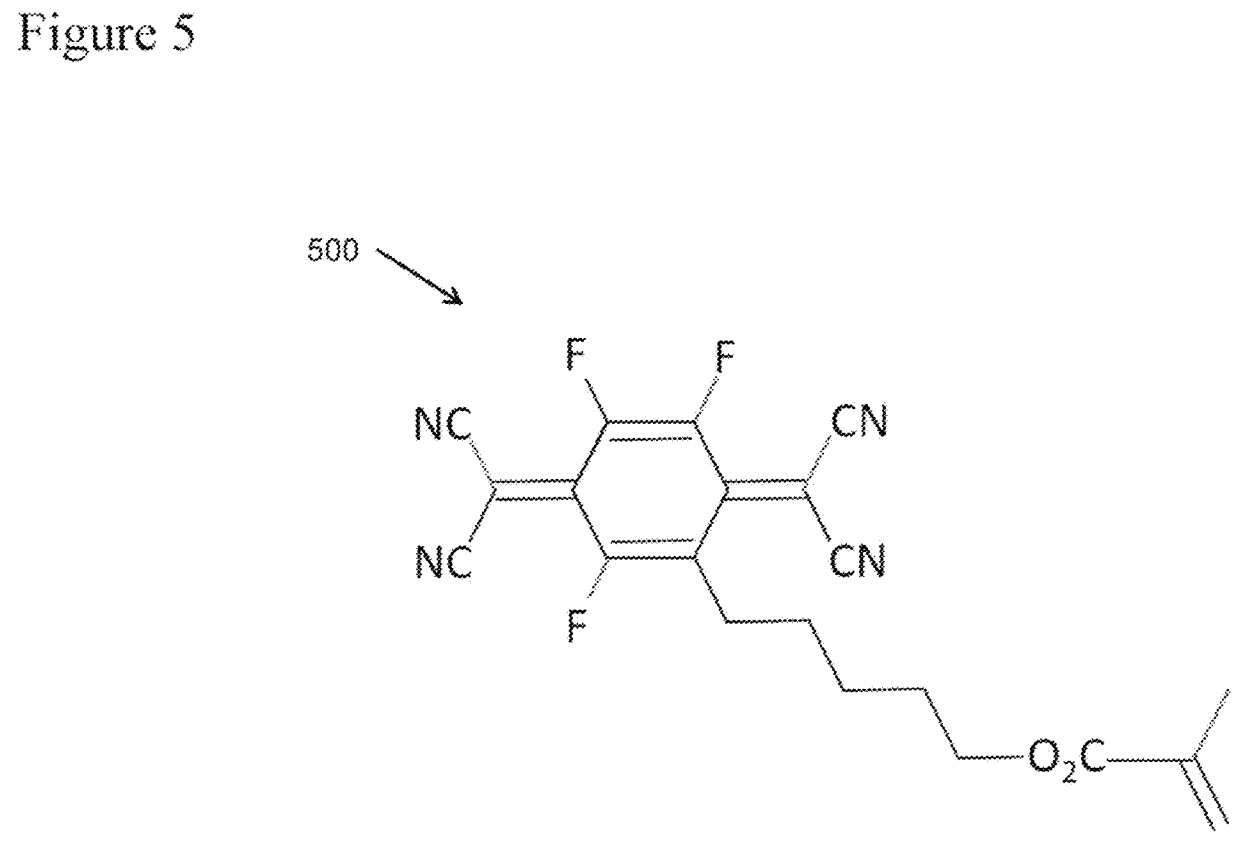

The next layer to be fabricated as shown in FIG. 1 is a p-doped hole transporting layer 104. The goal in the fabrication of this layer is to produce a relatively high conductivity film that minimizes the voltage drop between the anode and the emitter layer 106. This is accomplished by doping a monomeric chiral liquid crystalline hole transporting material with a strongly electron accepting monomeric p-dopant 500 illustrated in FIG. 5.

Figure 6:
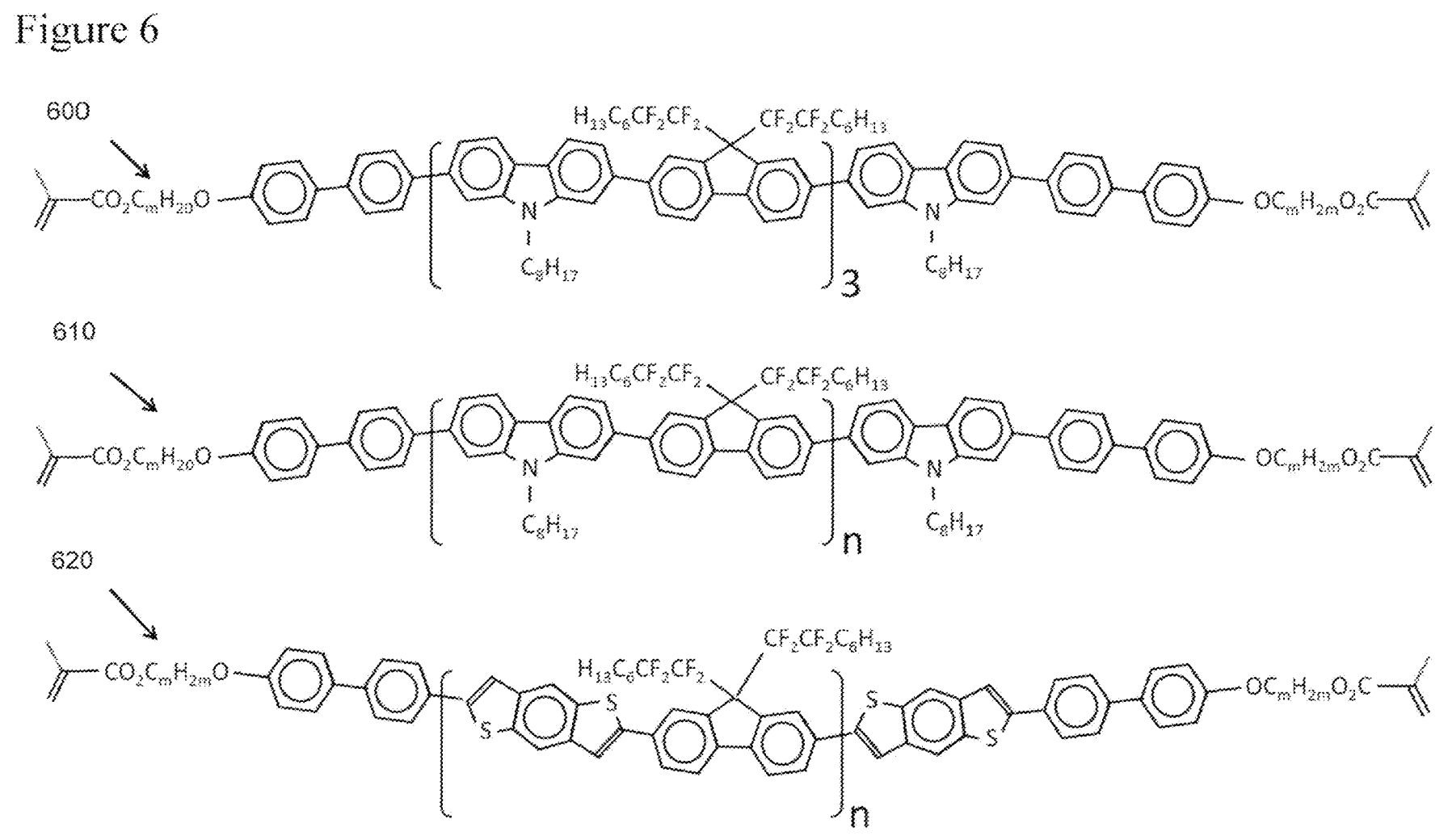

In order to achieve a complete photonic stop band in a relatively thin layer of chiral material (on the order of one to two microns in thickness) it is necessary that the chiral nematic monomers used to produce layer 104, shown in FIG. 1, and the other chiral liquid crystalline layers in the device have a very high ratio of their extraordinary refractive indices to their ordinary refractive indices. This, in turn, means that their molecules' long axes be much longer than the molecules are wide. An example of such a hole transporting liquid crystalline material 600 is illustrated in FIG. 6. An alternate representation of such a hole transporting liquid crystalline material 610 is also shown, where n=3 and m=10. Materials with m having other values between 5 and 12 may also be used. Another example of these types of materials 620 is also shown in FIG. 6. Here material 620, has an n value of 3 and an m value of between 5 and 12, may be used in this layer.

Since all of the chiral liquid crystalline polymer layers in the device need to be matched in terms of ordinary and extraordinary refractive indices, it may be necessary to introduce less birefringent liquid crystalline monomer materials into the mixture of materials in this layer to tune the refractive indices. For instance, compounds having the above formulas with n=1 or 2 might be used as additives to tune refractive index.

Figure 7:
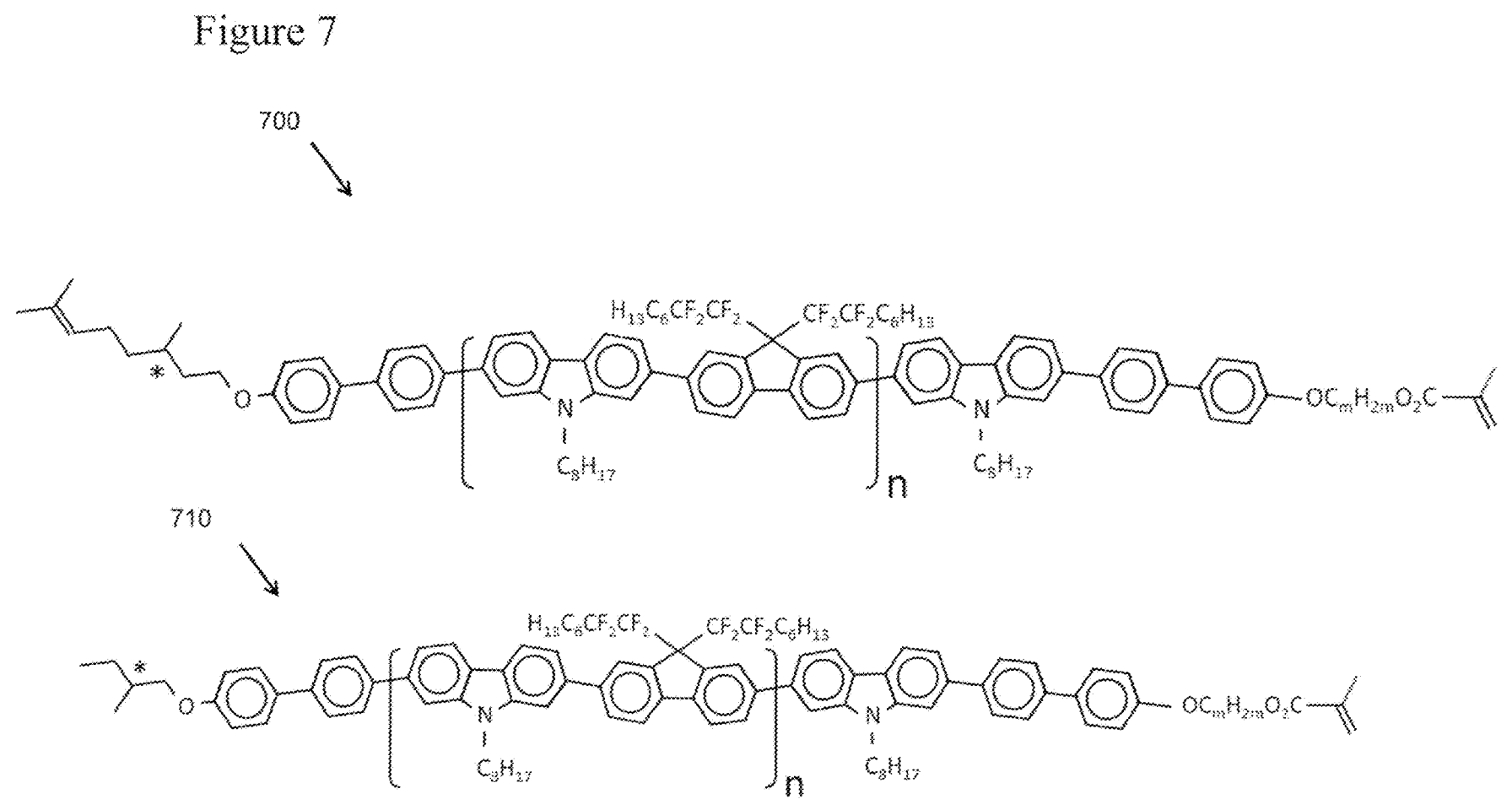

In order to produce a chiral liquid crystalline polymer of the required pitch, it is necessary to dope the monomer mixture used to produce layer 104 in FIG. 1 with a chiral dopant. Exemplary chiral dopants are illustrated by general formula 700 shown in FIG. 7. Chiral dopants 700 have an n value of 1 to 3 and an m value of 5 to 12 and the molecular center of asymmetry is highlighted by the asterisk. Alternatively chiral dopants illustrated by formula 710, also shown in FIG. 7 may be used, dopants 710 have an n value of 1 to 3 and an m value of 5 to 12 and the molecular center of asymmetry is highlighted by the asterisk.

Referring back to FIG. 1 the mixture of monomers and p-dopant 500 to be used to form layer 104 is solvent cast over the photoalignment layer 103 and solvent is allowed to evaporate off either at room temperature or an elevated temperature. Once the solvent is gone the material is in the form of a layer of chiral nematic liquid crystalline fluid or possibly a chiral nematic liquid crystalline glass. The anisotropic surface energy at the top surface of layer 103 induces the molecules of the chiral nematic material at the interface between layers 103 and 104 to be aligned with their molecular long axes surface parallel and with their molecular long axes all substantially in the same direction thus producing the desired helical structure in layer 104.

The next layer to be fabricated in the layer by layer process is the hole transporting layer 105. The function of this layer is to convey electrically conducting holes from p-doped layer 104 into emitter layer 106. In doing so the holes transition in energy from the highest occupied molecular orbital (HOMO) levels in the conductive dopant in layer 104 to the HOMO energy levels of emitter layer 106. The layer is produced by the solvent casting of a solution of a mixture of chiral nematic liquid crystalline monomers in a manner similar to that used to produce layer 104 except that there is no p-dopant in the mixture. After the solvent used to cast the monomeric mixture evaporates away the material of the mixture forms a layer of chiral nematic liquid crystalline fluid or a chiral nematic glass on the top surface of layer 104. The liquid crystalline order of layer 104 provides a template such that the long axes of the molecules at the bottom surface of layer 105 are aligned parallel with the long axes of the nematic molecular cores of the polymeric material at the top surface of layer 104. In this way the helical structure induced by the chiral nature of the materials in layers 104 and 105 is continuous in passing across the interface between the two layers. Once the material of layer 105 is in place and properly aligned it is polymerized by exposure to ultraviolet light. The chiral nematic monomeric materials that are used to form layer 105 may be the same as were used to produce layer 104 except that the p-dopant is omitted. The exact chemical structure of the molecules used and their molecular lengths is dictated by the requirement that the ordinary and extraordinary refractive index components of the mixtures in the two layers must match each other and the helical pitches of the chiral nematic structures within the two layers must also be the same.

Figure 8:
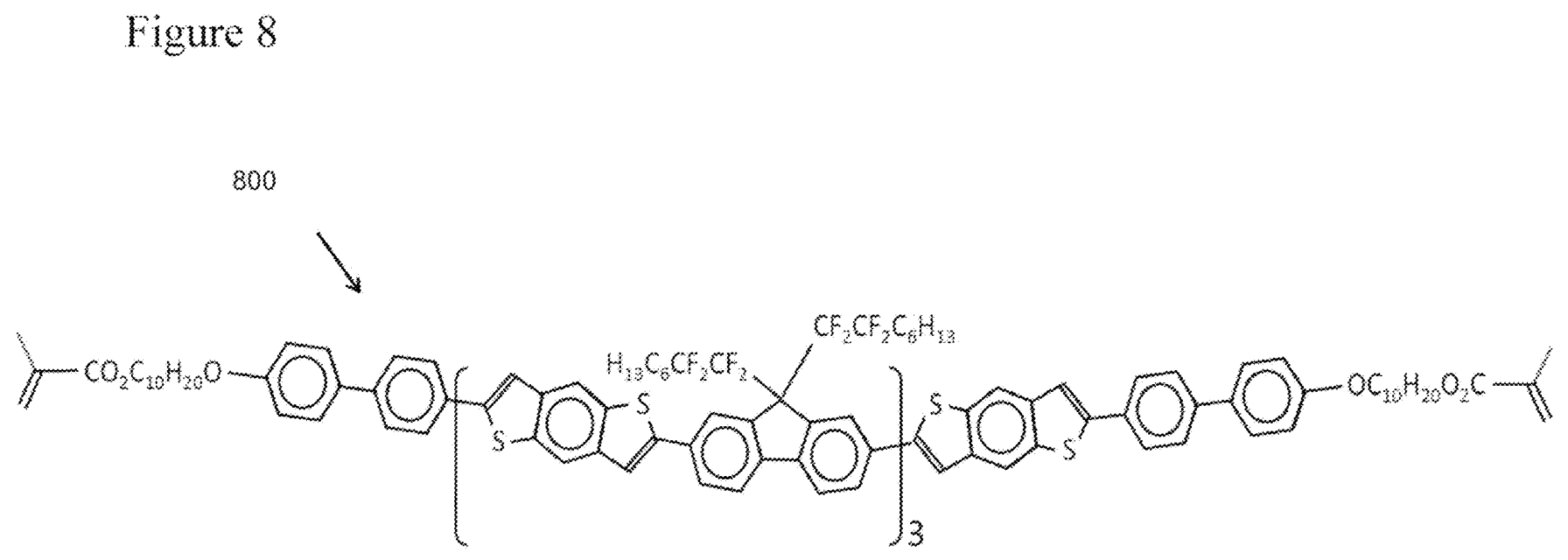

The emitter layer 106 of the device may consist solely of a monomeric nematic electroluminescent material doped with a chiral additive to produce a helical structure of the proper pitch. One suitable electroluminescent nematic material 800 is illustrated in FIG. 8. However, a more preferable formulation for the material in this layer is to utilize an electroluminescent dopant doped into a host composed of a mixture of monomeric chiral nematic materials. This approach has a number of advantages, for example, the dopant concentration may be chosen so as to minimize self-absorption of light by the dopant; the monomeric host chiral nematic materials may be blended to produce a mixture that is ambipolar, that is to say, electron and hole mobilities are approximately equal; and non-liquid crystalline emitter materials such as phosphorescent emitters with very high quantum efficiencies may be utilized as dopants while maintaining the desired helical structure of the chiral host.

Rays of light that are entrained in the helical photonic crystal structure have their associated electric vectors all oriented parallel to the planes of the device layers. As a result, this light will only interact with excited molecules whose transition moments are also substantially in the plane of the device. Therefore, electroluminescent materials whose molecules are preferentially oriented so that their transition moments are in the device plane will yield the highest device energy efficiencies (external quantum efficiencies) when used in the emitter layers of the devices of embodiments of this invention.

Figure 9:
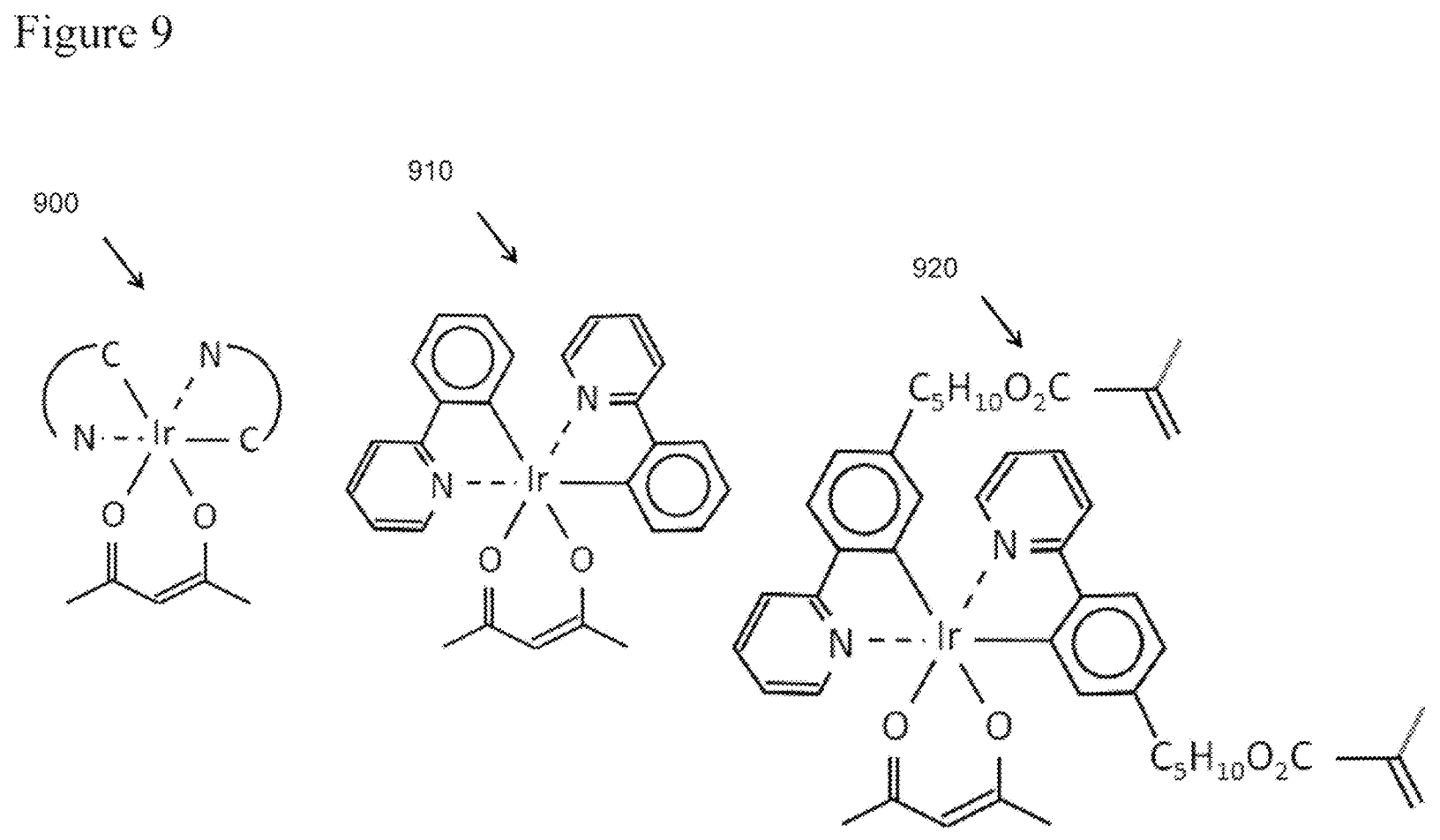

Some emitter layer host materials spontaneously align with their long axes in the plane of the emitter layer upon vacuum deposition in the fabrication of small molecule OLEDs. When these host materials are doped with phosphorescent heteroleptic phosphorescent iridium organometallic dopants containing general structure 900, illustrated in FIG. 9, the light emitting dopants are aligned with their transition moments in the plane of the layer.

In these molecules the iridium is complexed to a single molecule of the bidentate ligand acetylacetone (2,4-cyclopentanedione). It is also bound by covalent iridium to carbon bonds to two bidentate ligands each of which are also bound to the iridium by a coordinate iridium to nitrogen bond. An example of such a molecule, 910, is Ir(ppy)$_2$(acac).

When doped at a concentration of 8% into the host material 4,4'-bis(carbazol-9yl)biphenyl (CBP) in the emissive layer of a vacuum deposited, small molecule OLED device, this green light emissive material yields unusually high emission efficiency because the molecules of the phosphorescent material are aligned with their transition moments largely in-plane. A monomeric version, 920 of this material may be doped into a chiral nematic monomer host and the resulting mixture is used to form layer 106 of FIG. 1.

Figure 10:
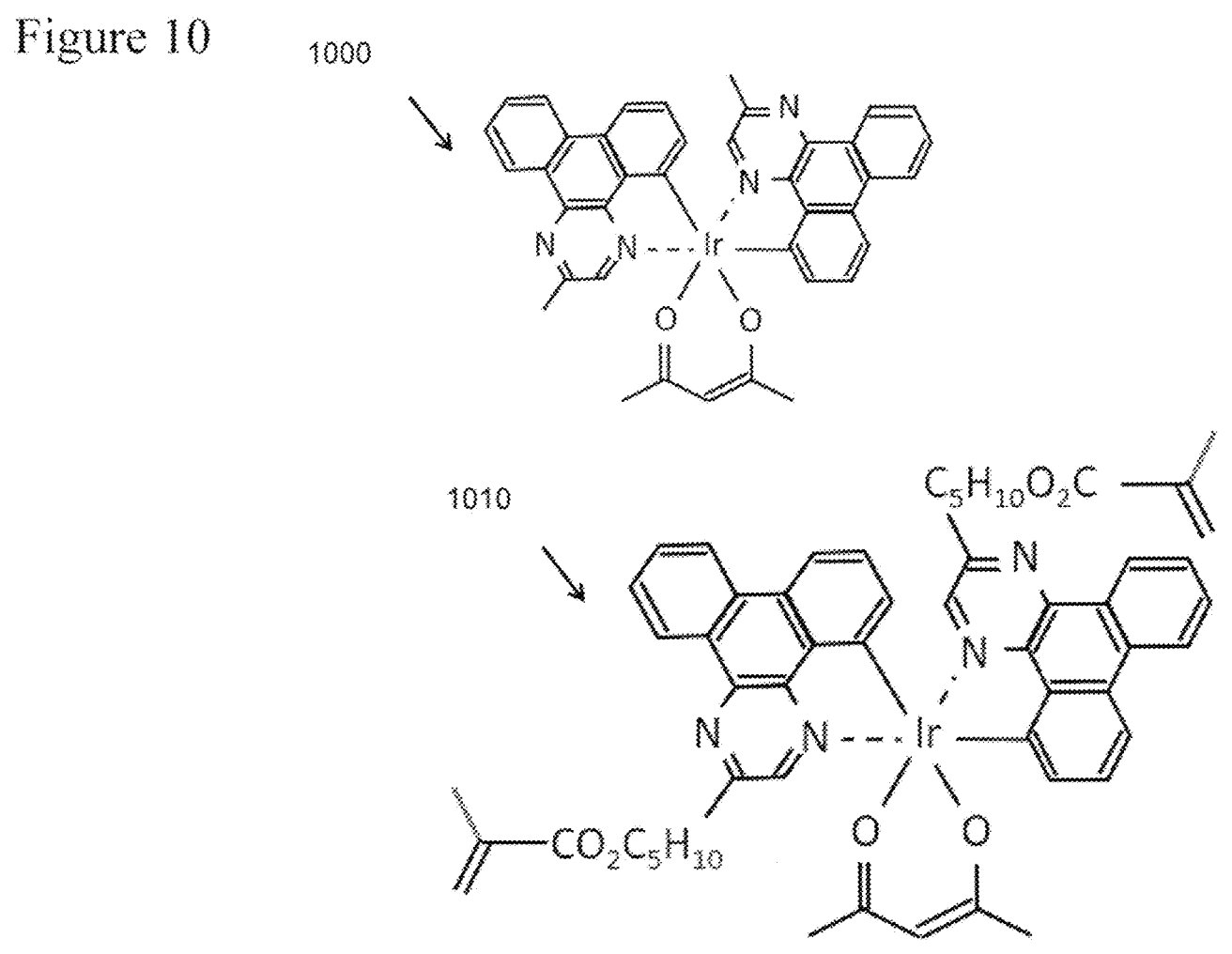

Similarly, the red emissive material, 1000 illustrated in FIG. 10, bis(2methyldibenzo[f,h]quinoxaline)(acetylacetonate)iridium III [Ir(MDQ)2(acac)] may be doped into the host material N,N'di(naphthalen-1-yl)-N,N'-diphenylbenzidene (NPB) in the emissive layer of a vacuum deposited, small molecule OLED device yielding in-plane alignment of the emitter transition moments A monomeric version, 1010 of this material is also illustrated in FIG. 10, which may be doped into a chiral nematic monomer host and this mixture used to form layer 106.

The use of an ambipolar host material in layer 106 allows for balanced injection of electrons and holes into the emitter layer with recombination to yield excitons occurring away from the layer boundaries avoiding traps that may exist at the layer boundaries. Blending a hole transporting, monomeric, chiral nematic host material with an electron transporting, monomeric, chiral nematic host material may be used to produce an ambipolar host material. Examples of hole transporting host materials are illustrated by general formula 1100 in FIG. 11.]

Figure 11:
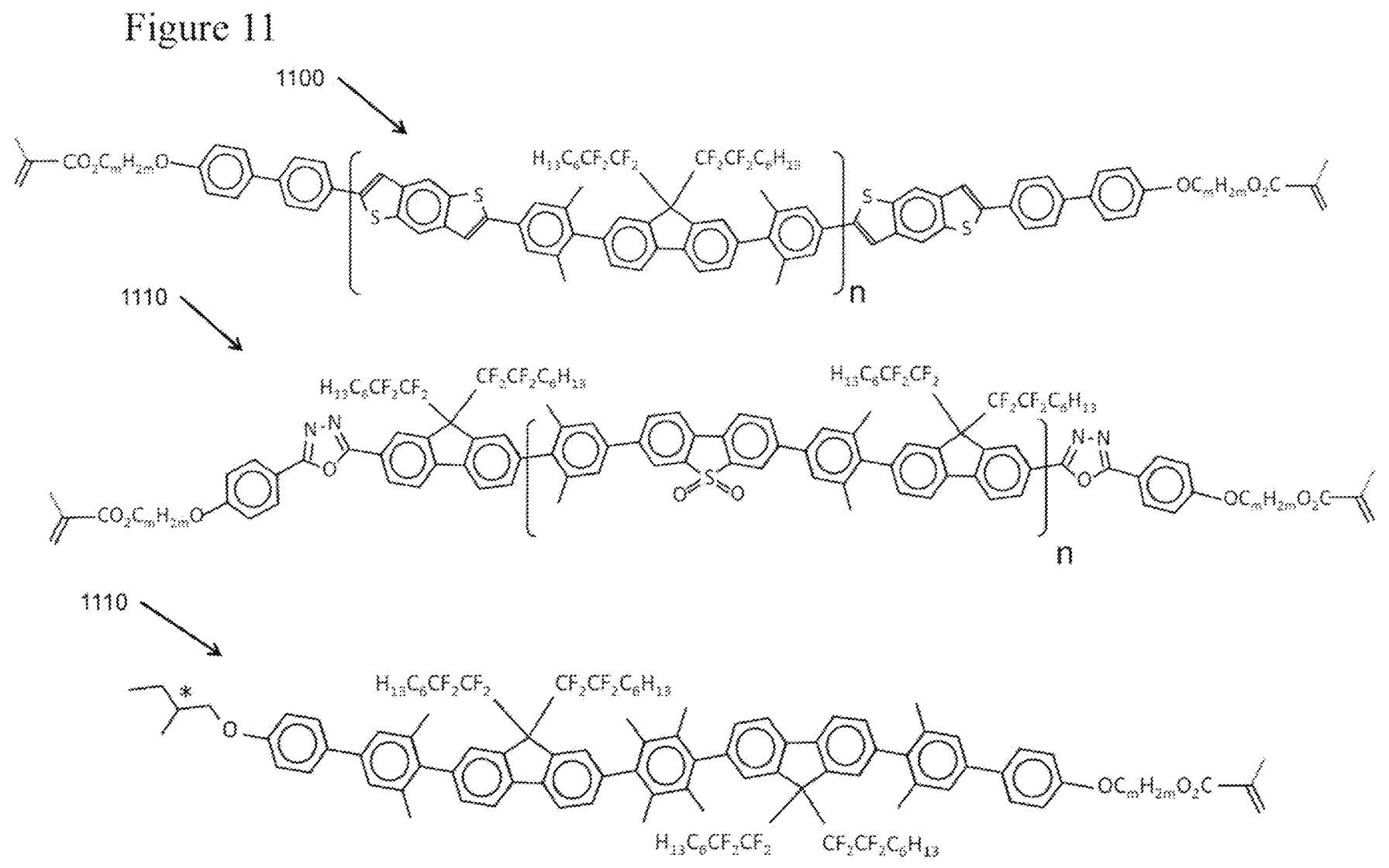

Similarly examples of electron transporting host materials are illustrated by general formula 1110. These materials that may be blended with materials 1100 to produce an ambipolar host mixture are also shown in FIG. 11.

By blending appropriate amounts of the two type of compounds, an ambipolar mixture can be achieved. Further, by blending materials with suitable values of n, a mixture with the right extraordinary and ordinary refractive indices to match the indices of layers 104 and 105, the helical pitch of the mixture may be adjusted based on the amount of a chiral dopant added. Examples of chiral dopants, 1120 are illustrated in FIG. 11, where m=5 to 12 and the molecular center of asymmetry is highlighted by the asterisk.

The next device layer to be fabricated is the electron transporting layer 107. The function of this layer is to convey electrons from n-doped layer 108 into emitter layer 106. In doing so the electrons transition in energy from the electron energy levels in the conductive dopant in layer 108 to the HOMO energy levels of emitter layer 106. The layer is produced by the solvent casting of a solution of a mixture of chiral nematic liquid crystalline monomers in a manner similar to that used to produce previous layers. After the solvent used to cast the monomeric mixture evaporates away, the material of the mixture forms an aligned layer of chiral nematic liquid crystalline fluid or a chiral nematic glass due to the template effect from the underlying layer. In this way the helical structure induced by the chiral nature of the materials in layer 107 and all the previous layers in the device is continuous in passing across the interfaces between the two layers. The helical structure is polymerized so as to lock it into place by exposure to UV light.

Figure 12:
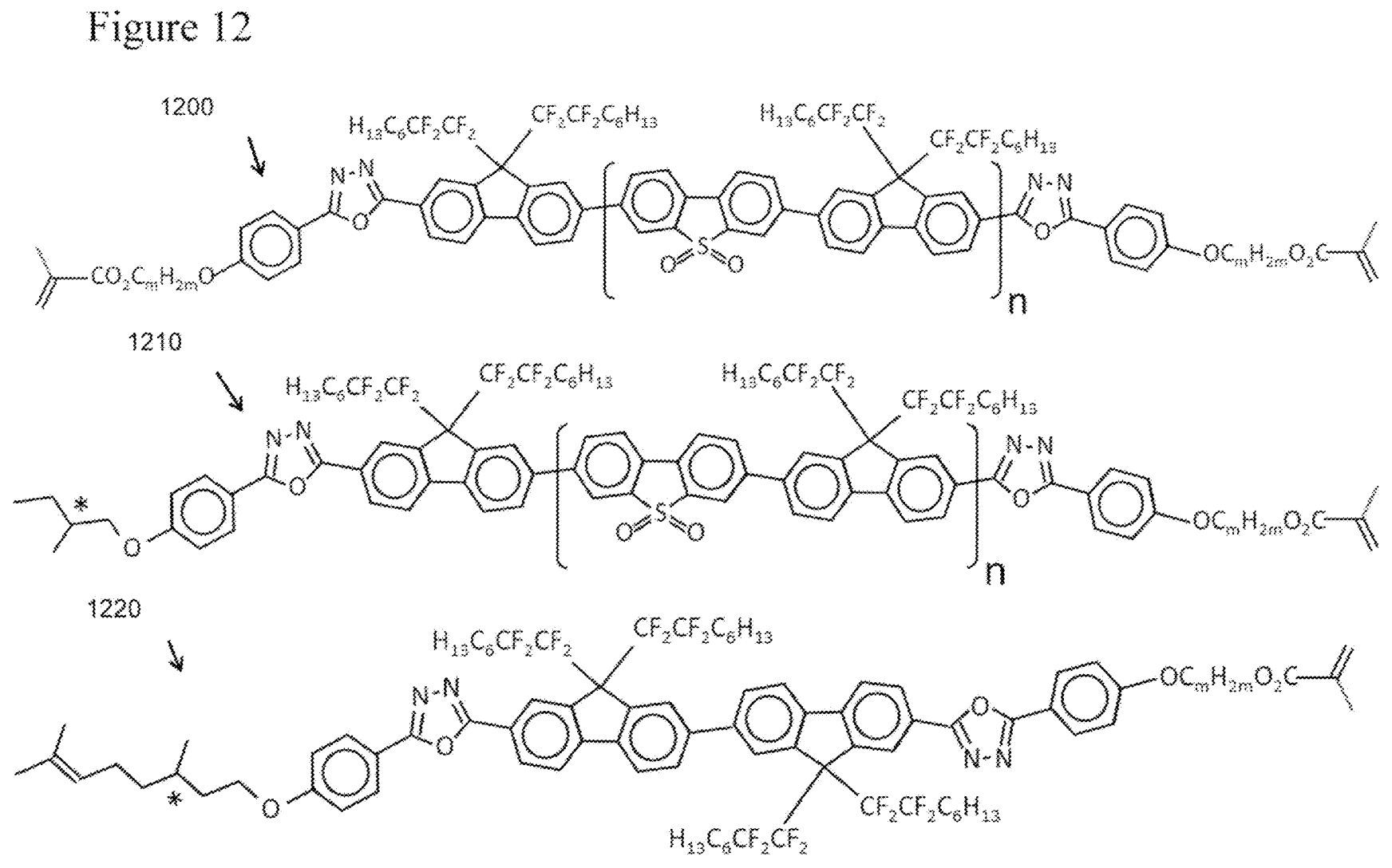

Electron transporting layer 107 is fabricated from a mixture of monomeric nematic materials, examples 1200 of which are illustrated in FIG. 12 where n is 1 to 3 and m is 5 to 12. By blending materials that are members of this series with suitable values of n, a mixture with the right extraordinary and ordinary refractive indices to match the indices of layers 104, 105 and 106 may be formulated. The helical pitch of the mixture may be adjusted based on the amount of a chiral dopant added. Examples of chiral dopants 1210 that may be used are illustrated in FIG. 12 where n=1 to 3, m=5 to 12, and the molecular center of asymmetry is highlighted by the asterisk. Examples of other chiral dopants, 1220, that may be used are further illustrated in FIG. 12, where m=5 to 12 and the molecular center of asymmetry is highlighted by the asterisk.

Figure 13:
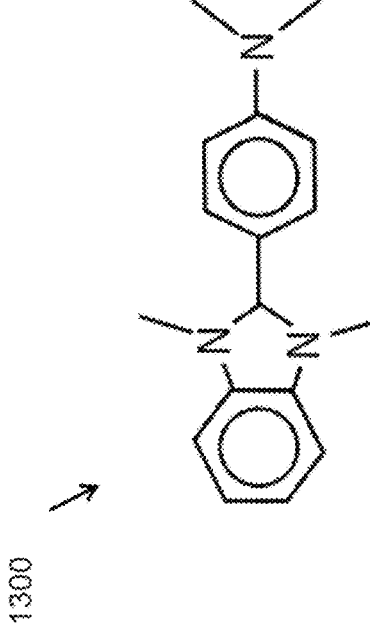
FIG. 13 illustrates the molecular structure for an n-dopant.

The next device layer to be fabricated is the n-doped electron transporting layer 107. The function of this layer is to convey electrons from the cathode 110 or possibly from an optional electron injection layer 108 into the electron transporting layer 107. In doing so the electrons transition in energy from the electron energy level of the cathode work function to the lowest unoccupied molecular orbital (LUMO) energy levels of the electron transporting layer 107. The layer is produced by the solvent casting of a solution of a mixture of chiral nematic liquid crystalline monomers in a manner similar to that used to produce previous layers. The layer also incorporates an n-dopant, 1300 such as the dopant (4-(1,3-dimethyl-2,3-dihydro- 1Hbenzoimidazol-2-yl)phenyl)dimethylamine (N-DBMI), as illustrated in FIG. 13, which is activated by heating after the film is solvent cast.

After the solvent used to cast the monomeric mixture evaporates away, the material of the mixture forms an aligned layer of chiral nematic liquid crystalline fluid or a chiral nematic glass due to the template effect from the underlying layer. In this way the helical structure 109 induced by the chiral nature of the materials in layer 108 and all the previous layers in the device is continuous in passing across the interfaces between the two layers. The helical structure is polymerized so as to lock it into place by exposure to UV light.

Layer 108 may fabricated using the same mixture of monomeric nematic materials as were used for layer 107, for example 1200, where n=1 to 3 and m=5 to 12. By blending materials that are members of this series with suitable values of n a mixture with the right extraordinary and ordinary refractive indices to match the indices of layers 104, 105, 106, and 107 may be formulated. The same chiral dopants may also be used to adjust the pitch of the helical structure, for example 1210 where n=1 to 3, m=5 to 12, and the molecular center of asymmetry is highlighted by the asterisk as shown in FIG. 14; and 1420 where m=5 to 12 and the molecular center of asymmetry is highlighted by the asterisk as also shown in FIG. 12.

Optionally, layer 108 may be capped with an electron injection layer 1010. Layer 1010, for example, may comprise lithium fluoride or cesium carbonate. Layer 1011 is a cathode and may, for example, be made from a low work function metal such as aluminum.

When device 100 is energized, holes flow from anode 102 through hole injection layer 102 and layers 104 and 105 into emitter layer 106. At the same time electrons flow from cathode layer 1011 through layers 1010, 108 and 107 into emitter layer 106. The electrons and holes recombine on luminescent material molecules in layer 106 yielding excitons. Since emitter layer 106 is inside a helical photonic crystal structure, excitons created in that layer cannot emit circularly polarized light at wavelengths in the stop-band of the photonic crystal if that light has the same sense of rotation as helical chiral liquid crystal structure 109. It does, however, emit circularly polarized light with the opposite sense of rotation as helical chiral liquid crystal structure 109.

Figure 14B:
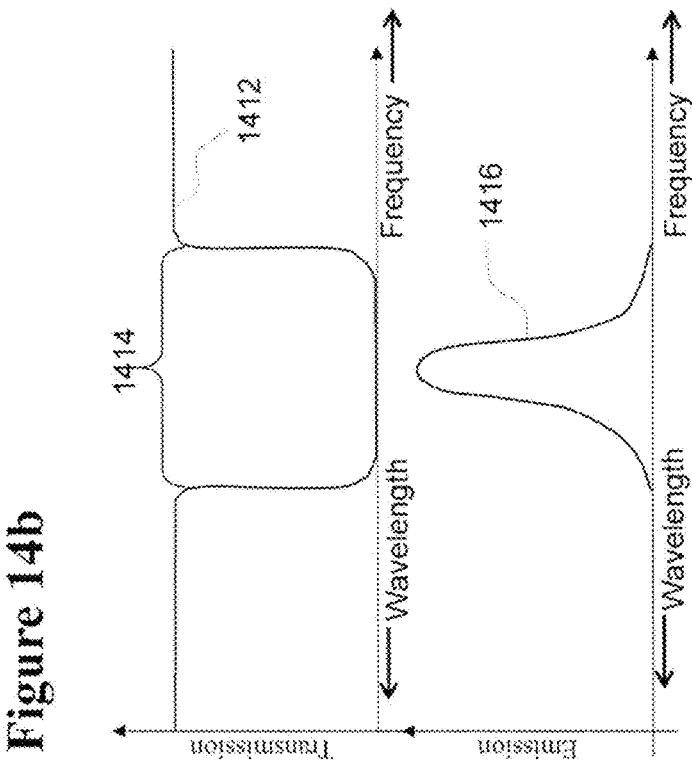
FIG. 14b illustrates the transmission spectrum of a polymerized chiral liquid crystal structure in the device disclosed in this application.
Figure 14A:
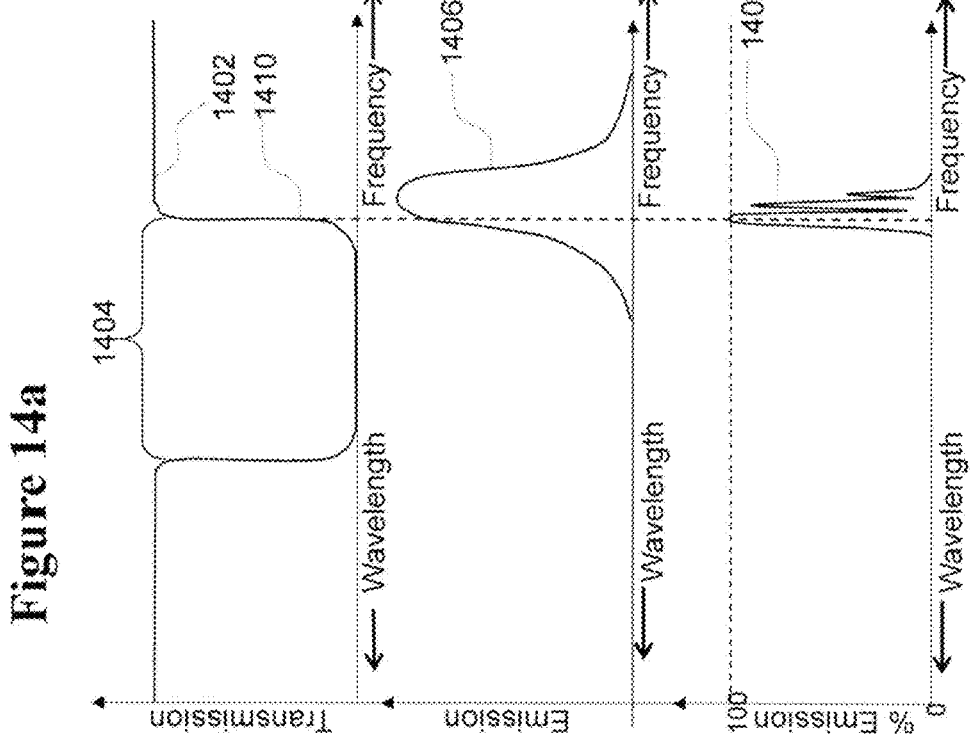
FIG. 14a illustrates the transmission spectrum of a polymerized chiral liquid crystal structure like that found in OLED device of International Patent Application No. PCT/US2017/21867.

It is in the formulation of the materials in emitter layer 106 that the chiral OLED device 100 of an embodiment of this invention differs from band-edge emitting chiral OLED device 700 of International Patent Application No. PCT/US2017/21867. The difference between the two devices is best explained by recourse to FIGS. 14A and 14B. In FIG. 14a the transmission spectrum 1402 of a polymerized chiral liquid crystal structure 79 like that found in OLED device 7100 of International Patent Application No. PCT/US2017/21867 is depicted. This spectrum contains a stop band or reflection band 1404. The chiral liquid crystalline host of emitter layer 76 of device 7100 is doped with an electroluminescent dopant with emission spectrum 1406. This spectrum 1406 overlaps the edge 1410 of stop band 1404 and as a result the electroluminescent dopant emits light into band edge light propagation modes 1408. In FIG. 14b the transmission spectrum 1412 of a polymerized chiral liquid crystal structure 109 in device 100 of this application is depicted. Device 100 is fabricated in such a way that the pitch of its helical chiral structure 109 is the same as the pitch of the helical chiral liquid crystal structure 79 of device 7100 of International Patent Application No. PCT/US2017/21867. Thus transmission spectrum 1412 is the same as transmission spectrum 1402 and as a result stop band 1416 of device 100 has the same spectral location and breadth as stop band 1404 of device 7100. The difference between the two devices is that spectrum 1416 of the electroluminescent dopant in emitter layer 106 of device 100 is located within or very nearly all within the stop band 1414 in the transmission spectrum 1402 of chiral structure 109 in device 100. Because of this the emission of circularly polarized light with the same sense of rotation as the sense of rotation of helical chiral liquid crystal structure 109 in device 100 is suppressed. For example, if the helical structure 109 in device 100 is a right-handed helix, the emission of right circularly polarized light from the electroluminescent material in layer 106 of the device will be suppressed. Thus, in this case, device 100 will emit left circularly polarized light, light having the opposite sense of rotation as compared to the sense of rotation of the helical structure 109 in device 100. In the case of device 7100 of International Patent Application No. PCT/US2017/21867 the light that is emitted into the band edge modes of the device has the same sense of rotation as the helical chiral liquid crystalline structure 709 in device 7100. Thus, devices 7100 and 100 having identical helical chiral liquid crystalline structures will emit light with opposite senses of circular polarization.

The devices 100 of this application may have some advantages and also disadvantages as compared to those 7100 described in application International Patent Application No. PCT/US2017/21867. Because the devices 7100 produce light by stimulated emission they emit light into a relatively narrow cone of angle about the vertical to the surface of the device. On the other hand, the devices of the type described in this application emit light by spontaneous emission and may emit light into a wider cone of angles. This may advantageous for some applications.

Figure 15:
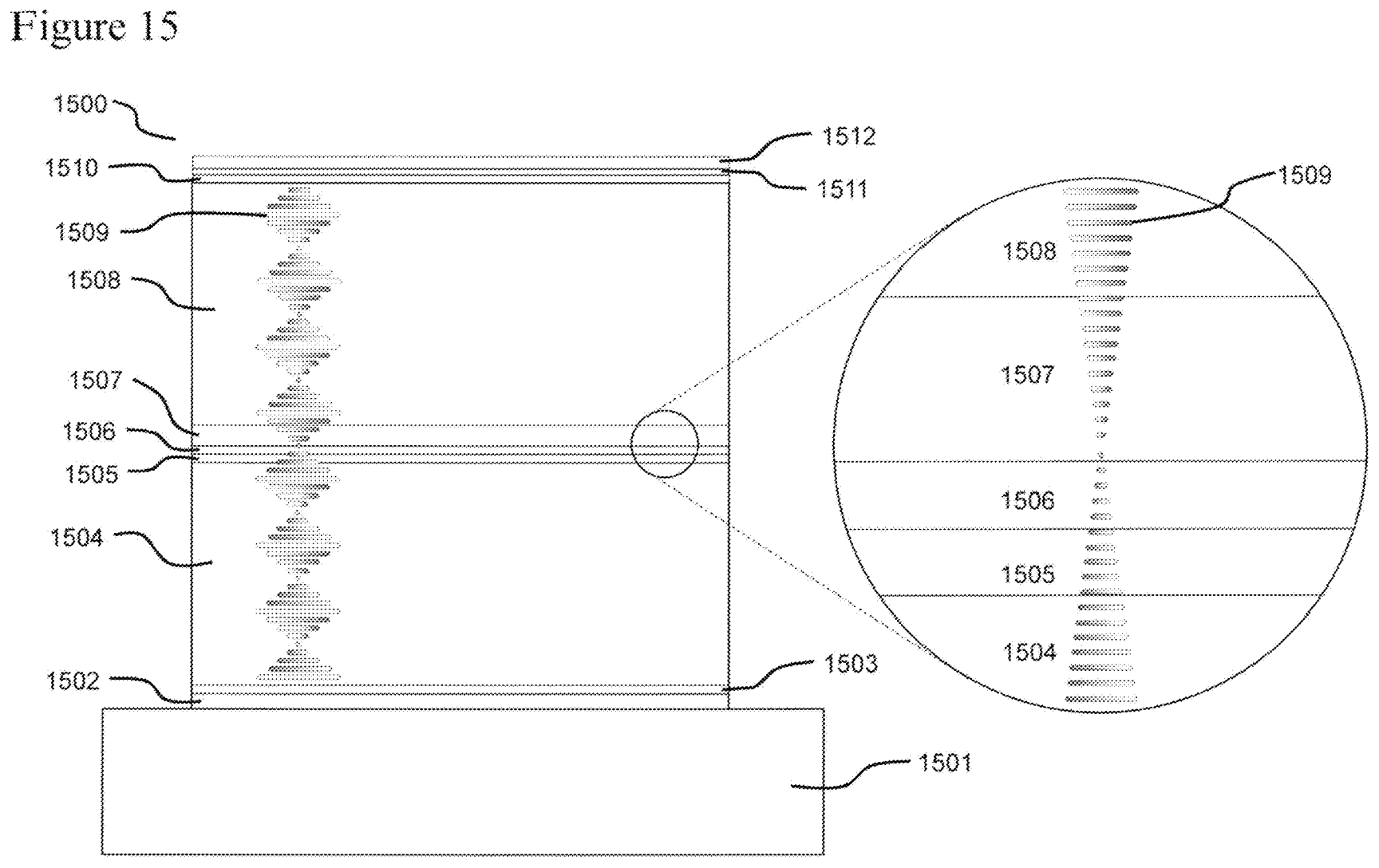

If the cathode layer 111 in device 100 is fabricated from a reflective metal such as aluminum and the layer thick enough to conduct electricity from an outside power source into the interior layers of the device, light will be reflected from layer 111 and emerge from the device through the bottom surface of transparent substrate 101. An alternative device structure 1500 that yields a transparent OLED is shown in FIG. 15. In this device layers 1502 through 1508, structure 1509, and layer 1510 all perform the same functions as the equivalent layers in device 100. However, in this device the metal cathode layer is quite thin, for instance, on the order of 5.0 nanometers in thickness and is therefore largely transparent. Because such a thin metal layer isn't sufficiently conductive on its own, it is backed with a transparent conductor layer 1512 fabricated from, for instance, indium-tin oxide. A device of this type will emit light from both its top and bottom surfaces. A light reflective layer can also be optionally added either directly on top of substrate 1501 or on its bottom surface. In that case the device would emit light from the upper surface of layer 1512 only.

Figure 16:
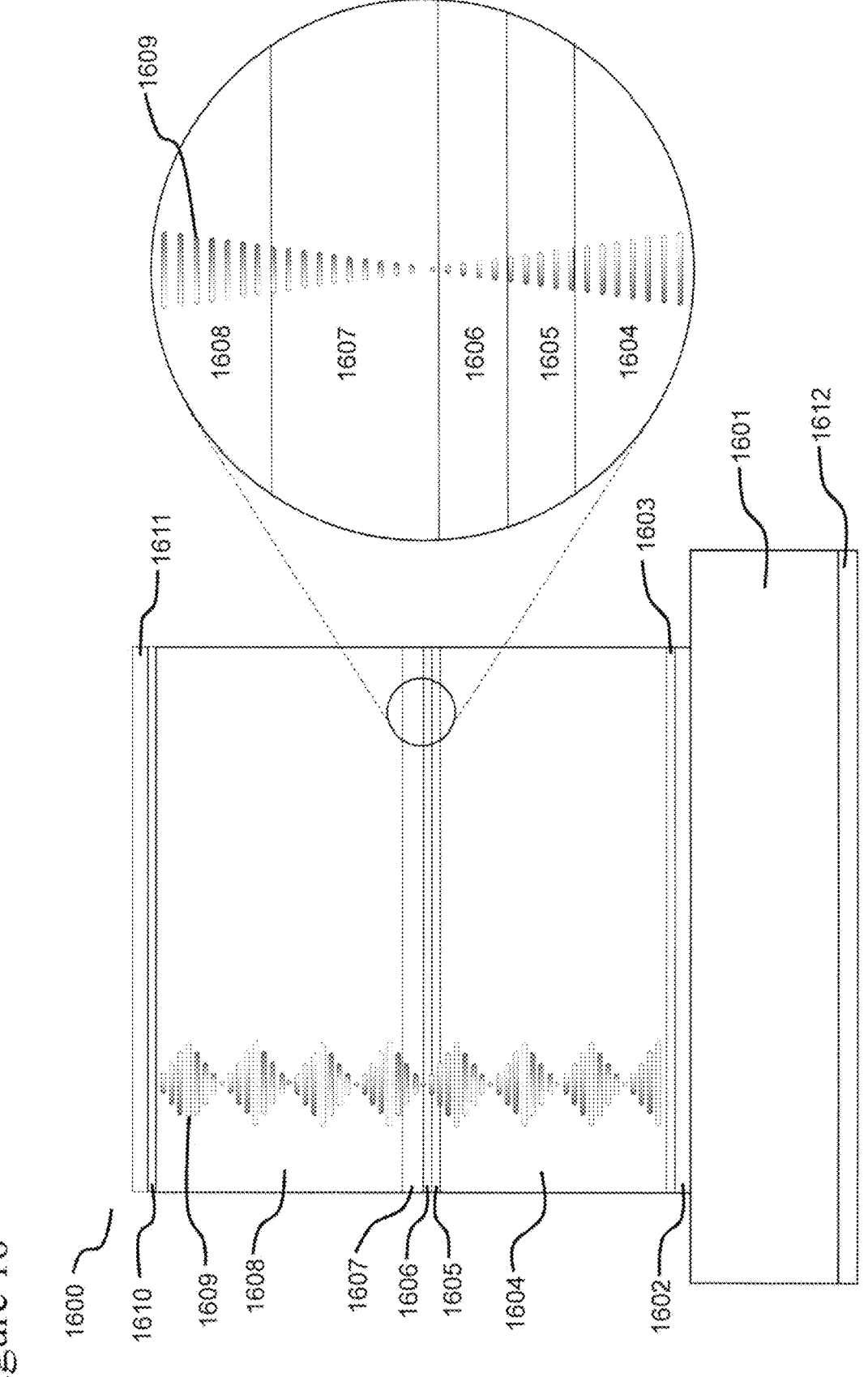
FIG. 16 illustrates an OLED device that emits linearly polarized light.

In some cases it is desirable that the OLED device 100 emit linearly rather than circularly polarized light. An embodiment 1600 of the invention that accomplishes this is shown in FIG. 16. In this device layers 1602 through 1608, structure 1609, and layer 1610 all perform the same functions as the equivalent layers in device 100. However, a sheet of quarter wave retarder film is attached to the bottom of substrate 1601. This material retards one of the linearly polarized components of the circularly polarized light emerging from the bottom surface of substrate 1601 such that the two linearly polarized components are in phase yielding linearly polarized light. The axis of linear polarization will depend on the orientation of the fast axis of the retarder film.

As pointed out by Kelly and O'Neill in U.S. patent application Ser. No. 10/519,761 a linearly polarized light emitting OLEDs can find great utility in backlighting liquid crystal displays (LCDs). The quarter wave retardation film required to convert the circularly polarized light output of device 100 of an embodiment of this invention or device 7100 described in application International Patent Application No. PCT/US2017/21867 to linear polarized light may be located on the light emissive surfaces for instance as is the case with device 1600. However, the quarter wave retardation film may also be applied to the back of the LCD.

Figure 17:
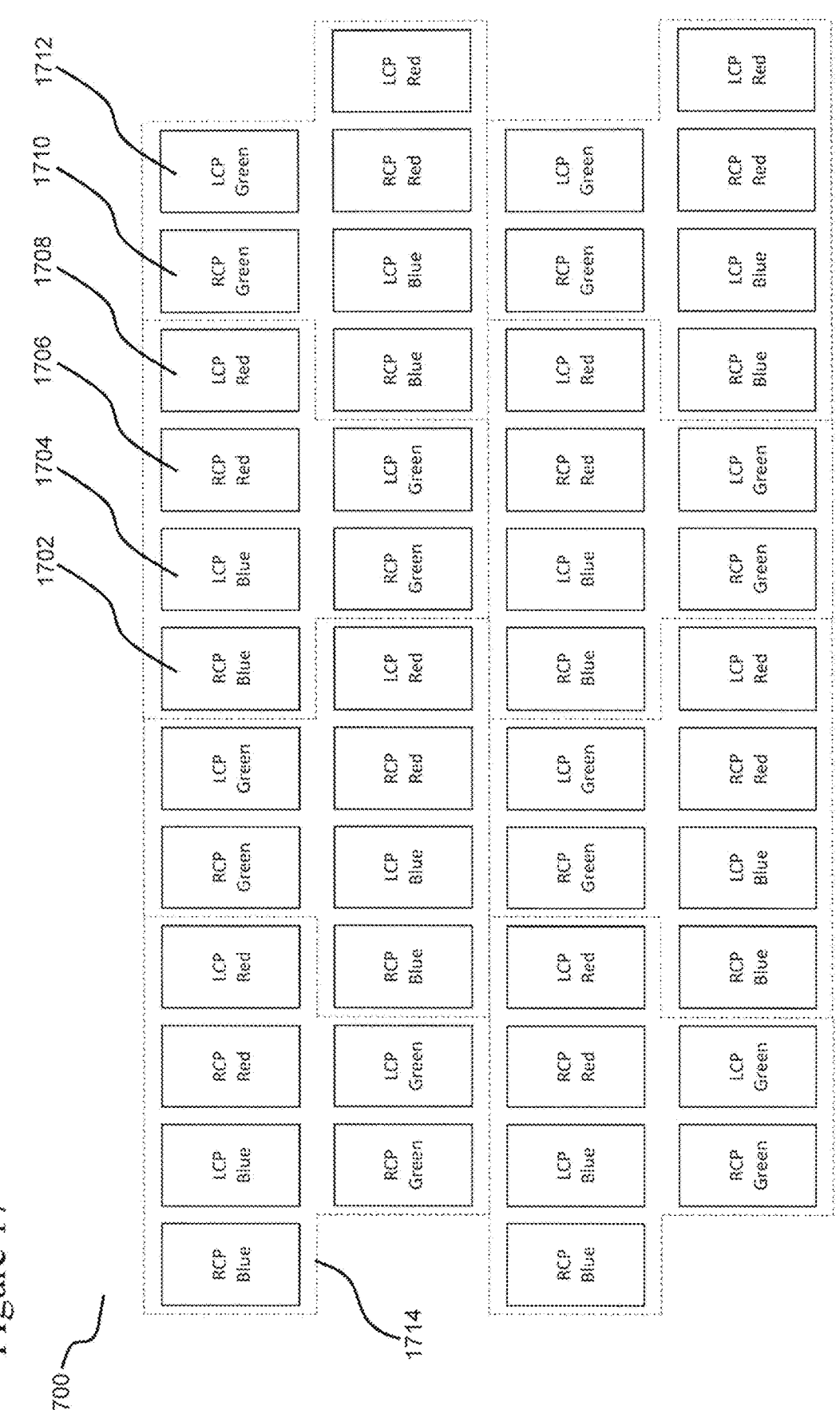
FIG. 17 illustrates a plan view of a triad pixel configuration of a dot matrix display.

The circularly polarized light emitting devices described in this application as well as those described in International Patent Application No. PCT/US2017/21867 may be combined together as sub-pixels in a dot matrix display. As such they may have great utility in stereoscopic displays. Since the chiral liquid crystalline materials used in these devices may be patterned using an ultraviolet light exposure through a photomask it is possible not only to pattern sub-pixels of multiple colors, but also by using materials with both right and left handed chiral pitches to patterned interspersed right circularly polarized and left circularly polarized pixels in the same display. The result is that one can intersperse both the right hand and left hand images of a stereo pair of images in the same display. A portion of the pixel pattern 1700 of such a display is depicted in FIG. 17. Six types of sub-pixels make up the pixels; right circularly polarized blue light emitting sub-pixels 1702, left circularly polarized blue light emitting sub-pixels 1704, right circularly polarized red light emitting sub-pixels 1706, left circularly polarized red light emitting sub-pixels 1708, right circularly polarized green light emitting sub-pixels 1710, and left circularly polarized green light emitting sub-pixels 1712. These sub-pixels combine in groups of six to form triad stereo-pixels that are delineated by the dashed lines (e.g. 1714) in FIG. 17. Eight pixels are shown. By placing a uniformly aligned quarter wave retarder film over such a display the right circularly polarized and left circularly polarized light emitted by the sub-pixels in the display may be converted into two orthogonal linear polarizations. A viewer wearing glasses with properly and orthogonally aligned polarizers over their left and right eyes with see the left image of the stereo-pair of images portrayed through the polarized glass over their left eye and the right image of the stereo-pair of images through the polarized glass over their right eye. The two images will then be combined in the brain to yield a 3-D image. The triad pixel configuration depicted in FIG. 17 is only one example of the many pixel configurations that might be used in a device that includes the chiral liquid crystal structure shown in FIG. 1. For instance, the commonly used stripe pixel configuration is also possible. Quad pixels that use four colors (e.g. red, blue, green, yellow) are possible as well as monochrome pixels.

An alternative approach involves sub-pixels consisting of either the devices (e.g. 100) of embodiments of this invention or the devices of application International Patent Application No. PCT/US2017/21867 (e.g. 7100 of that application) that all emit circularly polarized having the same sense (e.g. right circularly polarized). Then a pixelated quarter wave retarder plate is placed over and registered to the sub-pixels of the display. The pixel pattern 1800 of a display of this type is depicted in plan view in FIG. 18. Sub-pixels 1802, 1804, 1806, 1808, 1810, and 1812 function in much the same manner as do those in embodiment 1700 above.

Figure 18:
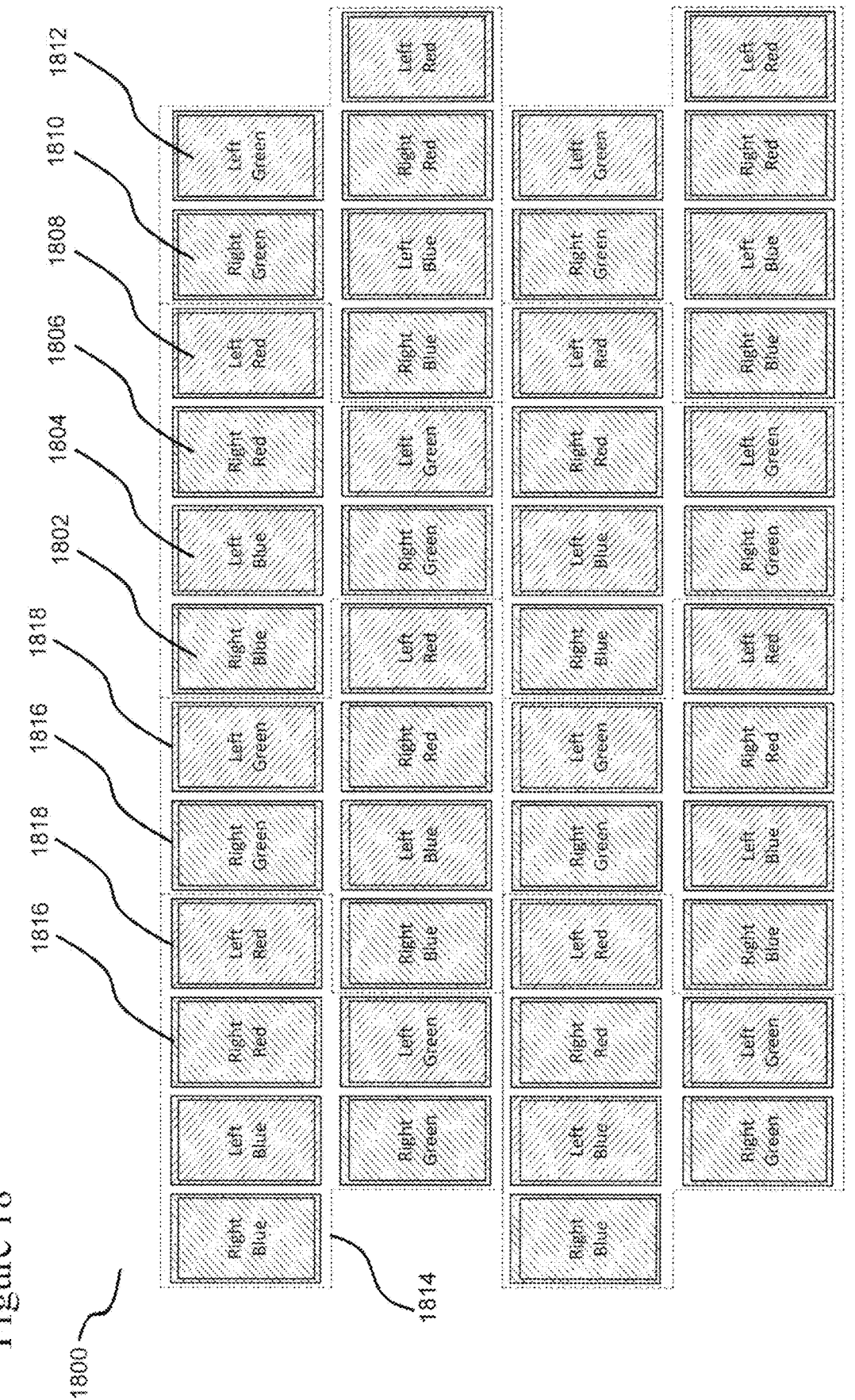
FIG. 18 illustrates a plan view of a pixel pattern of a dot matrix display using an alternative approach involving sub-pixels that all emit circularly polarized having the same sense.

The difference is that all the sub-pixels are made of individual OLED devices containing chiral liquid crystal structures that have the same helical sense (e.g. a counterclockwise twist as one travels down the helix perpendicular the plane of the view in FIG. 18). For this reason all of the sub-pixels emit light with the same circular polarization. The legends "right" and "left" on each sub-pixel in FIG. 18 do not denote the sense of the circular polarization of the emitted light or the relative position of one sub-pixel to another. Rather, they refer to which of the stereo pair of images the sub-pixel is contributing light to. Overlaid and registered over the pixels is quarter wave optical retarder film that is pixelated such that that the fast axis of the film 1816 overlaid over the sub-pixels labelled "right" is orthogonal, but in the same plane (the plane of the surface of the display) as the fast axis of the film 1818 overlaid over the sub-pixels labelled "left". The crosshatching in areas 1816 and 1818 of the retarder film is intended to differentiate the areas 1816 from areas 1818 and is not intended to necessarily show the direction of the fast axis in each area. Circularly polarized light emitted by each sub-pixel will encounter the quarter wave retarder film and be converted into linearly polarized light with the light from the sub-pixels labelled "right" polarized in a direction perpendicular to that emitted from sub-pixels labelled "left".

Figure 19:
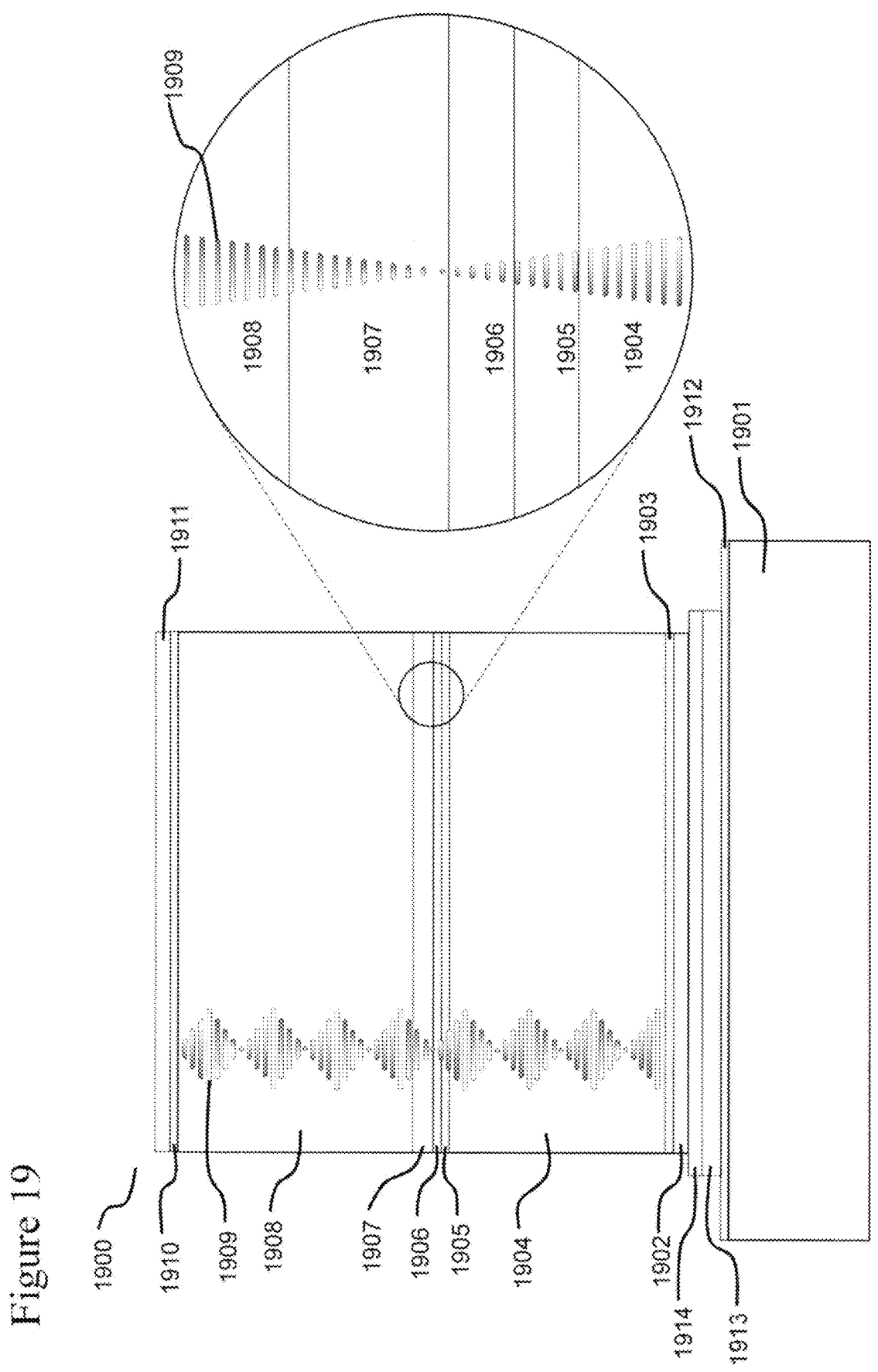
FIG. 19 illustrates the structure of a single sub-pixel in a 3-D display.

The method for producing a display with the pixel pattern 1800 may explained by reference to FIG. 19. Once again, this figure depicts the structure of a single sub-pixel in a 3-D display. In an actual display a large number of these pixel structures would be patterned side-by-side to produce the full up video dot matrix array. The functions of layers 1902 through 1908, structure 1909, and layers 1910 and 1911 are the same as they were in device 100 in FIG. 1 or in device 7100 in FIG. 7 of application International Patent Application No. PCT/US2017/21867. Before these layers and structures are fabricated a layer 1913 of liquid crystal photoalignment material (such as polyvinyl cinnamate) is solvent cast on the surface of substrate 1901. The liquid crystal photoalignment material 1913 has the property that when it is exposed to linearly polarized ultraviolet light of the proper wavelength it is induced to have an anisotropic surface energy. A photomask is used to expose the areas of the liquid crystal photoalignment material 1913 that will underlie the sub-pixels labelled "Right" in FIG. 18 to linearly polarized ultraviolet light. Next the photoalignment material 1913 that will underlie the sub-pixels labelled "Left" but not those labelled "Right" in FIG. 18 is exposed through a second photomask to linearly polarized light whose direction of polarization is perpendicular to that used to expose the material underlying sub-pixels labelled "Right". Then a layer 1914 of photocrosslinkable nematic liquid crystalline monomer material is solvent cast over the photoalignment material under all of the sub-pixels. Under each sub-pixel this material has its long molecular axes aligned uniformly in the same direction by the anisotropic surface energy of the underlying photoalignment layer 1913. Since the nematic material is uniaxially birefringent, the layer 1914 acts as a retarder plate and if the proper thickness of material is coated down it will act as a quarter wave retarder plate. Since the direction of highest surface energy in areas of the surface of layer 1913 underlying the sub-pixels labelled "Right" is perpendicular to the direction of highest surface energy in areas of the surface of layer 1913 underlying sub-pixels labelled "Left", the principal axis of birefringence of areas of layer 1914 underlying sub-pixels labelled "Right" will be perpendicular to the principal axis of birefringence of areas of layer 1914 underlying sub-pixels labelled "Left". Thus, layer 1914 has the optical retardation properties required for the function of devices 1800. Optional buffer layer 1915 may then be coated down on top of layer 1914 and anode layer 1902 and the subsequent device layers may be coated sequentially over layer 1915.

A device 2000 that may be used as a sub-pixel in a display in which each pixel emits light with not only with selected brightness and color, but also with apparent depth of focus information as well is depicted in FIG. 20. In this device layers 2002 through 2008, structure 2009, and layer 2010 all perform the same functions as the equivalent layers in device 100 and combine together to constitute the chiral organic light emitting diode 2027. Layer 2012 is a buffer layer, layer 2013 is a quarter wave optical retarder, and layer 2014 is a transparent electrode fabricated from, for instance, indium-tin oxide. This electrode sits atop diffractive cylindrical lens substrate 2015. This lens substrate may be a positive power binary optic lens or a positive power kinoform lens (equivalent to a convex conventional lens). The axis containing the centers of the circular cross-sections or the foci of the parabolic cross-sections of the cylinder that is equivalent to the lens surface topology is perpendicular to the plane of the figure. Lens substrate 2015 is coated with a liquid crystal photoalignment material (not shown) such as polyvinyl cinnamate or vinyl polymers containing benzoic acid esters of 7-hydroxycoumarin such as are well-known in the literature that has been exposed to plane polarized UV light so as to provide the proper homogenous alignment to the liquid crystal material in layer 2016. Layer 2016 is a layer of nematic liquid crystal with a positive dielectric anisotropy. The molecules of the liquid crystal are aligned with their long axes perpendicular to the plane of the figure. Layer 2017 is a transparent electrode fabricated from, for instance, indium-tin oxide. Electrode 2017 is coated with a liquid crystal photoalignment material (not shown) such as polyvinyl cinnamate that has been exposed to plane polarized UV light so as to provide the proper homogenous alignment to the liquid crystal material in layer 2016. Layer 2018 is a transparent substrate formed, for instance, of glass or transparent plastic. Layers 2014, 2015, 2016, 2017 and 2018 combine to form the first electrically switchable, diffractive, liquid crystal cylindrical lens 2026. Layer 2019 is a layer of material that rotates the polarization axis of plane polarized light ninety degrees. It may be a polymerized twisted nematic liquid crystalline layer with a ninety degree twisted structure or it may be a half wave retarder layer. Layer 2020 is a transparent substrate layer and layer 2021 is a transparent electrode fabricated from, for instance, indium-tin oxide. Electrode 2021 is coated with a liquid crystal photoalignment material (not shown) such as polyvinyl cinnamate that has been exposed to plane polarized UV light so as to provide the proper homogenous alignment to the liquid crystal material in layer 2022. Layer 2022 is a layer of nematic liquid crystal with a positive dielectric anisotropy. The molecules of the liquid crystal are aligned with their long axes parallel with the plane of the figure. Layer 2023 is a diffractive lens substrate. This lens substrate may be a positive power binary optic lens or a positive power kinoform lens (equivalent to a convex conventional lens). The axis containing the centers of the circular cross-sections or the foci of the parabolic cross-sections of the cylinder that is equivalent to the lens surface topology is parallel to the plane of the figure. For this reason the surface relief of the lens facing into the liquid crystal layer 2022 is not visible in the figure, but it is similar to but orthogonal to the surface relief of lens substrate 2015. Lens substrate 2023 is coated with a liquid crystal photoalignment material (not shown) such as polyvinyl cinnamate that has been exposed to plane polarized UV light so as to provide the proper homogenous alignment to the liquid crystal material in layer 2022. Layer 2024 is a transparent electrode fabricated from, for instance, indium-tin oxide. The device 2000 is built up on substrate 2001.

As described above, when chiral OLED 2027 is energized, holes flow from anode 2002 and at the same time electrons flow from cathode layer 2011 with the result that they recombine in emitter layer 2006 producing light. As a result of the twisted chiral liquid crystalline structure 2009, this light is highly circularly polarized. Its sense or chirality of circular polarization is determined by chirality (right or left handed) of helical structure 2009. The light exits the chiral OLED through the lower surface of anode layer 2002 into buffer layer 2012 and thence into retarder layer 2013. In layer 2013 the circularly polarized light is converted into plane polarized light because one of the linearly polarized components of the incident circularly polarized light is slowed in propagation speed with respect to other with the result that the two plane polarized components are in phase with each other. The orientation of the optical axis of optical retarder 2013 is such that that the linearly polarized light that emerges from layer 2013 is perpendicular to the plane of FIG. 20. The light passes through transparent electrode 2014 and through diffractive lens substrate 2015. If there is no electric field imposed between electrodes 2014 and 2017, the linearly polarized light encounters a medium that has a refractive index equal to the extraordinary refractive index of the liquid crystal in layer 2016. The extraordinary refractive index of the liquid crystal in layer 2016 will, in general, be higher than that of the medium in lens substrate 2015. This means that the doublet lens combination 2015/2016 will have negative power for light exiting the chiral OLED. Light entering the doublet lens from the chiral OLED will be nearly collimated, thus giving the impression it is from a source at an infinite distance. Once it passes through the negative power 2015/2016 negative doublet, it will be diverging and thus appear to be diverging from a light source between the doublet and an infinite distance. The apparent location of this light source will depend on the optical power of the lens substrate 2015, its refractive index and the extraordinary refractive index of the liquid crystal in layer 2016. Since the doublet lens 2015/2016 is a cylindrical lens doublet, the virtual light source will be a line source. If sufficient electric field is applied across electrodes 2014 and 2017, the liquid crystal material in layer 2016 will be largely switched into a configuration in which the long axes of the liquid crystal molecules are parallel to the plane of FIG. 20 and perpendicular to the surface of anode 2017. When light passes through layer 2016 in this configuration, it encounters a medium with a refractive index equal to the ordinary refractive index of the liquid crystal in layer 2016. If the liquid crystal mixture in layer 2016 is properly formulated, the ordinary refractive index of the liquid crystal material may match the refractive index of diffractive lens substrate 2016. The lens doublet 2015/2016 will then have no optical power and the sub-pixel then appear to be at an infinite distance. If a proper means of liquid crystal alignment is used at the two surfaces bounding layer 2016, it should be possible to tune the lens power between the field full on and field full off configurations by adjusting the electric field between the electrodes 2014 and 2017. (See details below.)

Next light that has passed through tunable lens 2026 passes through substrate 2018 and into polarization rotating layer 2019. This layer rotates the light's axis of linear polarization by ninety degrees. Layer 2019 may be a half wave retarder plate or it may be a polymerized twisted nematic liquid crystalline layer with a thickness of one quarter of the helical pitch. After passing through the polarization rotating layer 2019 the light emitted by the chiral OLED passes through substrate layer 2020 and a transparent electrode layer 2021 fabricated from, for instance, indium-tin oxide. The light next passes into liquid crystal layer 2022 through it into diffractive lens substrate 2023 and transparent electrode 2024 fabricated from, for instance, indium-tin oxide. If there is no electric field imposed between electrodes 2021 and 2024, the linearly polarized light passing from electrode 2021 into liquid crystal layer 2022 encounters a medium that has a refractive index equal to the extraordinary refractive index of the liquid crystal in layer 2022. The extraordinary refractive index of the liquid crystal in layer 2022 will, in general, be higher than that of the medium in lens substrate 2023. This means that the doublet lens combination 2022/2023 will have negative power for light exiting the chiral OLED and switchable lens 2026. If switchable liquid crystal lens 2026 is not activated light entering doublet lens combination 2022/2023 will appear to be from a line source somewhere on the opposite side of switchable lens 2026 from switchable lens 2025. Once it passes through the negative power 2022/2023 negative doublet, if the refractive index and the optical power of lens substrate layer 2023 and the extraordinary refractive index of the liquid crystal in layer 2022 are chosen properly and if tunable lens 2025 is not electrically activated, light emerging from tunable lens 2025 will appear to be diverging from a point source somewhere between the doublet 2022/2023 and an infinite distance. The apparent location of this light source will depend on the optical power of the lens substrates 2015 and 2023, their refractive indices and the extraordinary refractive indices of the liquid crystal in layers 2016 and 2022. If sufficient electric field is applied across electrodes 2021 and 2024, the liquid crystal material in layer 2022 will be largely switched into a configuration in which the long axes of the liquid crystal molecules are parallel to the plane of FIG. 20 and perpendicular to the surface of anode 2021. When light passes through layer 2022 in this configuration, it encounters a medium with a refractive index equal to the ordinary refractive index of the liquid crystal in layer 2022. If the liquid crystal mixture in layer 2022 is properly formulated, the ordinary refractive index of the liquid crystal material may match the refractive index of diffractive lens substrate 2023. The lens doublet 2022/2023 will then have no optical power and if at the same time tunable lens 2026 is electrically fully activated, the sub-pixel will then appear to be at an infinite distance to a subject viewing the display. If a proper means of liquid crystal alignment is used at the two surfaces bounding layer 2022, it should be possible to tune the lens power between the field full on and field full off configurations by adjusting the electric field between the electrodes 2021 and 2024.

It is an important aspect of embodiments of the invention that the light emission properties of the chiral OLED devices make the use of the tunable liquid crystal lenses in device 2000 possible or more easily implemented. The chiral OLED device 2027 emits light within a narrow angular cone of emission. This allows the use the tunable lens structures without light passing to the sides of these structures and allows light emitted by the chiral OLED to appear to be coming from an object at an infinite distance when the tunable liquid crystal lenses are properly addressed. Further, the chiral OLED emits light into band edge light propagation modes that result in a narrow spectral band of light emission. This narrow band light emission is required because the tunable liquid crystal lenses are diffractive devices that only operate properly over a narrow wavelength band of light. Lastly, the chiral OLEDs emit circularly polarized light that can be readily converted to linearly polarized light (in layer 2013) with no light loss. If a non-polarized light emitting device was used more than half the light output would be lost in the conversion to polarized light.

Figure 21B:
Figure 21A:
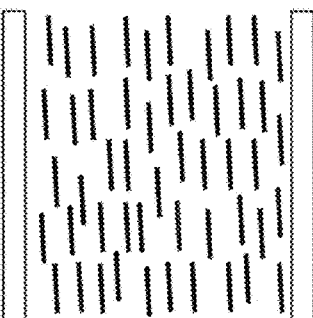
FIG. 21a illustrates a liquid crystal molecular alignment scheme in which the pre-tilted molecules at each substrate surface are parallel to each other.
Figure 21A:
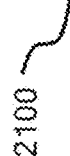

The liquid crystal molecular alignment in layers 2016 and 2022 is critical to the function of display 2000. Two liquid crystal molecular alignment schemes are shown in FIGS. 21*a* and 21*b*. In liquid crystal devices with substrate parallel molecular alignment and in which an electric field is used to rotate the molecular alignment upward perpendicular to the substrate surfaces, it is necessary that the unenergized liquid crystal alignment involve a small pre-tilt. That is to say, the molecules are uniformly aligned with one end of the long rod-shaped molecules slightly farther from the substrate surfaces than the other end. This must be done because, if the molecules are exactly parallel to the substrate surfaces, there are two equivalent directions in which the molecules can tilt up under an applied electric field. This would result in the formation of visible tilt domains. In configuration 2100 in FIG. 21*a*, the pre-tilted molecules at each substrate surface are parallel to each other. In configuration 2110 in FIG. 21*b*, the molecules at one substrate have an alignment that is rotated 180 degrees from that of the molecules at the other substrate. This results in a slightly splayed molecular alignment in the center of the liquid crystal layer.

When an electric field is applied across the molecules in configuration 2100, the molecules in the center of the liquid crystal layer will tilt up towards the direction normal to the substrate surfaces. When a strong electric field is applied the molecules in the center of the layer will essentially be perpendicular to the substrate surface with only a very few monolayers of molecules adjacent to the substrates not being perpendicular. These two states will function well in terms of adjusting the optical power of a tunable liquid crystal lens. However, the tilted molecular alignments at intermediate electric field strengths present a problem in that light will interact with the tilted birefringent medium and have its path bent. The apparent position of the sub-pixel will be diverted to the side from its desired location.

When an electric field is applied across the molecules in configuration 2110, the molecules near one substrate will tilt up in a configuration that mirrors the configuration of the molecules near the other substrate. In tilted molecular states at intermediate applied electric field levels any bending of light induced by the orientation of the molecules in the lower half of the liquid crystal layer will be counteracted by opposite bending of the light induced by the orientation of the molecules in the upper half of the liquid crystal layer. Thus if the alignment in configuration 2110 is used in liquid crystal layers 2016 and 2022 in FIG. 20 it may allow the tunable liquid crystal lenses to be switched to intermediate electric field setting yielding the ability to more continuously tune the optical power of the lenses.

FIG. 20 is a representation of a single sub-pixel of a dot-matrix graphic display. In order to produce a complete display, a great many of these sub-pixels need to be arranged together in a matrix. In addition, means must be provided to supply the required electric current levels to the chiral OLED device in each sub-pixel and the required voltage biases to the tunable liquid crystal lenses in each sub-pixel. An active thin film transistor (TFT) matrix (not shown in FIG. 20) may be used to address and provide the proper voltage levels to the OLED device 2027 in each sub-pixel. The transistors of this active matrix may be located, for instance, on the surface of buffer/substrate layer 2012 which may extend continuously under all of the chiral OLED devices 2027.

Active thin film transistor (TFT) matrices (not shown in FIG. 20) may also be used to address and provide the proper voltage levels to the tunable liquid crystal lenses 2025 and 2026 in each sub-pixel. The transistors of these active matrices may be located on the surfaces of substrates 2018 and 2020.

Sub-pixels 2000 of the type depicted in FIG. 20 may be used in display configurations of the types shown in FIGS. 17 and 18 or they may be used in active matrix graphic displays that do not have sub-pixel that display stereo pair information.

Figure 22:
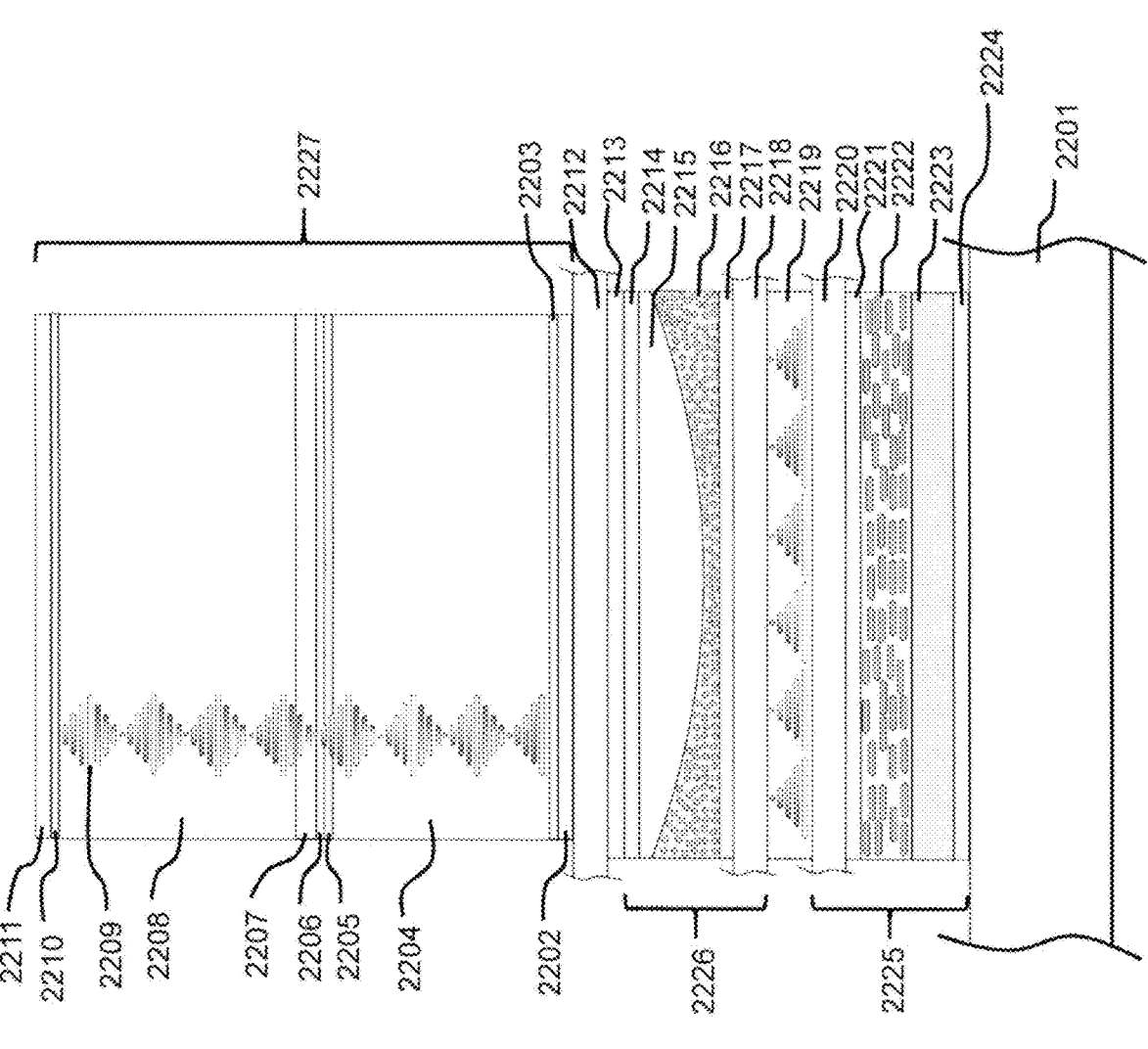
FIG. 22 illustrates a sub-pixel structure that utilizes a liquid crystal variable focus refractive lens system.

The sub-pixels 2000 of the type shown in FIG. 20 essentially combine a chiral liquid crystalline photonic crystal band edge emitting device of the type described in U.S. Provisional Patent Application 62/306,128 with a variable focus lens device such as the liquid crystal variable focus diffractive lens system portrayed in FIG. 20 and comprising elements 2026, 2019, and 2025. Other types of variable focus lens devices may be substituted for the variable focus diffractive lens system. For instance, in FIG. 22 depicts a similar sub-pixel structure 2200 that utilizes a liquid crystal variable focus refractive lens system.

In this sub-pixel architecture chiral OLED device 2227 performs the same function as does device 2027 in sub-pixel structure 2000. Thus, layers 2202, 2203, 2204, 2205, 2206, 2207, 2208, 2210, 2211, and helical structure 2209 are similar to and perform the same functions as the corresponding layers in sub-pixel structure 2000. An active thin film transistor (TFT) matrix (not shown in FIG. 22) may be used to address and provide the proper voltage levels to the OLED device 2227 in each sub-pixel. The transistors of this active matrix may be located, for instance, on the surface of buffer/substrate layer 2212 which may extend continuously under all of the chiral OLED devices 2227.

In sub-pixel structure 2200 layer 2212 is a buffer layer, layer 2213 is a quarter wave optical retarder, and layer 2214 is a transparent electrode fabricated from, for instance, indium-tin oxide. This electrode sits atop a refractive cylindrical lens substrate 2215. This lens substrate may be a conventional positive power refractive lens fabricated from a transparent material. The axis containing the centers of the circular cross-sections or the foci of the parabolic cross-sections of the cylindrical lens is perpendicular to the plane of the figure. Lens substrate 2215 is coated with a liquid crystal photoalignment material (not shown) such as polyvinyl cinnamate or vinyl polymers containing benzoic acid esters of 7-hydroxycoumarin such as are well-known in the literature that has been exposed to plane polarized UV light so as to provide the proper homogenous alignment to the liquid crystal material in layer 2216. Layer 2216 is a layer of nematic liquid crystal with a positive dielectric anisotropy. The molecules of the liquid crystal are aligned with their long axes perpendicular to the plane of the figure. Layer 2217 is a transparent electrode fabricated from, for instance, indium-tin oxide. Electrode 2217 is coated with a liquid crystal photoalignment material (not shown) such as polyvinyl cinnamate or vinyl polymers containing benzoic acid esters of 7-hydroxycoumarin such as are well-known in the literature that has been exposed to plane polarized UV light so as to provide the proper homogenous alignment to the liquid crystal material in layer 2216. Layer 2218 is a transparent substrate formed, for instance, glass or transparent plastic. Layers 2214, 2215, 2216, 2217 and 2218 combine to form the first electrically switchable, diffractive, liquid crystal cylindrical lens 2226. Layer 2219 is a layer of material that rotates the polarization axis of plane polarized light ninety degrees. It may be a polymerized twisted nematic liquid crystalline layer with a ninety degree twisted structure or it may be a half wave retarder layer. Layer 2220 is a transparent substrate layer and layer 2221 is a transparent electrode fabricated from, for instance, indium-tin oxide. Electrode 2221 is coated with a liquid crystal photoalignment material (not shown) such as polyvinyl cinnamate or other materials such are well-known in the literature that has been exposed to plane polarized UV light so as to provide the proper homogenous alignment to the liquid crystal material in layer 2222. Layer 2222 is a layer of nematic liquid crystal with a positive dialectic anisotropy. The molecules of the liquid crystal are aligned with their long axes parallel with the plane of the figure. Layer 2223 is a refractive lens substrate. This lens substrate may be a positive convex conventional lens. The axis containing the centers of the circular cross-sections or the foci of the parabolic cross-sections of the cylinder that is equivalent to the lens surface topology is parallel to the plane of the figure. For this reason the surface profile of the lens facing into the liquid crystal layer 2222 is not visible in the figure, but it is similar to but orthogonal to the surface relief of lens substrate 2215. Lens substrate 2223 is coated with a liquid crystal photoalignment material (not shown) such as polyvinyl cinnamate or other materials such are well-known in the literature that has been exposed to plane polarized UV light so as to provide the proper homogenous alignment to the liquid crystal material in layer 2222. Layer 2224 is a transparent electrode fabricated from, for instance, indium-tin oxide. The device 2200 is built up on substrate 2201.

The operating principle of sub-pixel structure 2200 may be seen to be the same as that for sub-pixel structure 2000 since the only change between the two architectures is that the electrically switchable refractive liquid crystal lenses 2225 and 2226 have replaced the electrically switchable diffractive lenses 2025 and 2026.

Figure 23:
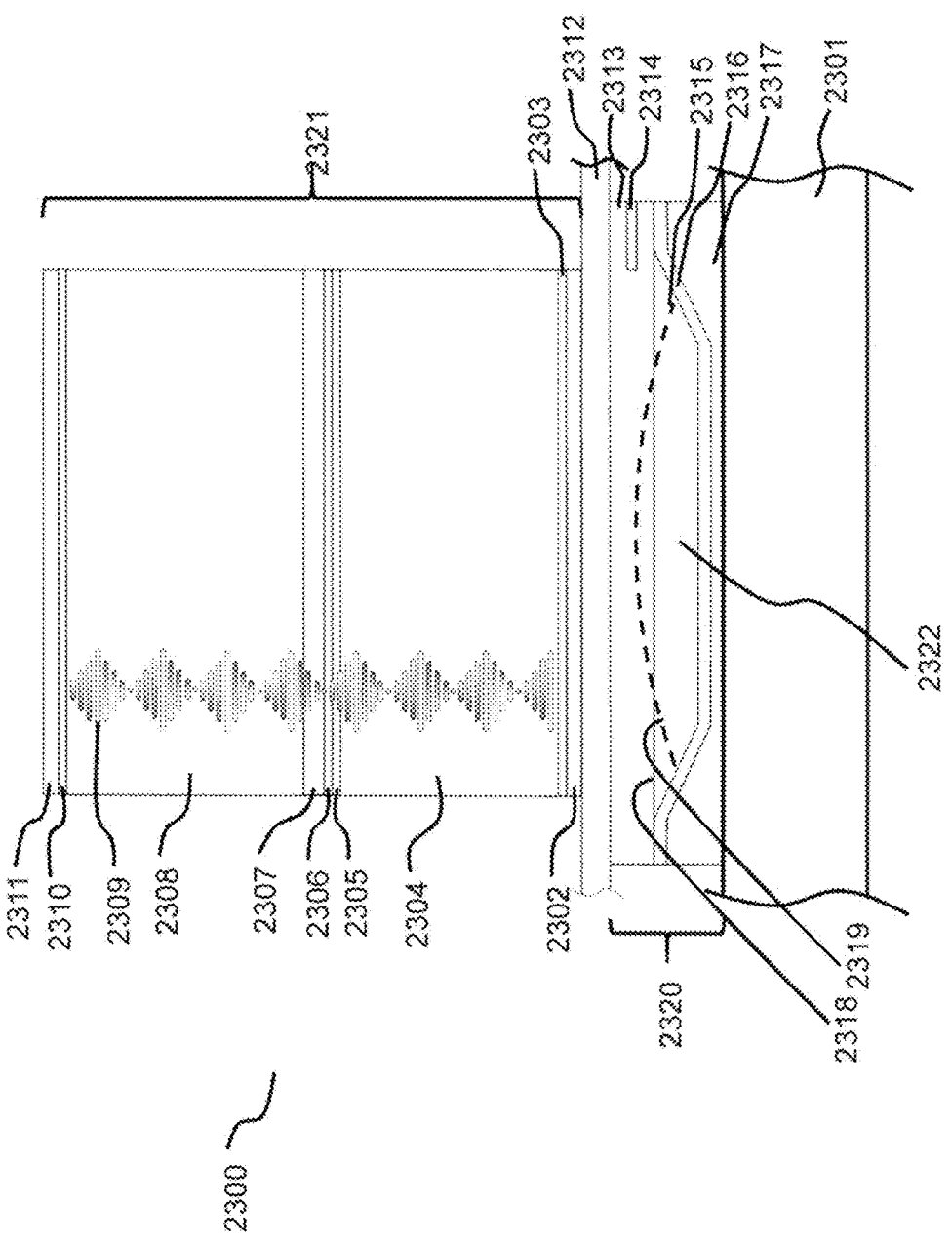
FIG. 23 illustrates an example of a sub-pixel structure that utilizes an electrowetting-based variable focus lens system.

Other variable focus lens devices besides those using liquid crystals as the electrically switchable element may also be used as the variable focus lens component of the display sub-pixel. An example 2300 is depicted in FIG. 23. In this architecture the layers and their function in the OLED portion 2321 of the sub-pixel are the same as or similar to those of OLED portions 2027 and 2227 of sub-pixel architectures 2000 and 2200.

In architecture 2300 layer 2312 is a buffer or substrate layer. As in the previous architectures 2000 and 2200 the transistors of an active matrix used to drive the several sub-pixel chiral OLEDs 2321 may be located on the surface of buffer/substrate layer 2312 which may extend continuously under all of the chiral OLED devices 2321.

Elements 2313, 2314, 2315, 2316, and 2317 combine to form an electrowetting switchable lens device such as that described in US Patent Application Publication 2007/0179200 and European Patent EP-B1-1,166,157. Element 2313 is an electrically displaceable conductive fluid. An electrode 2314 is in contact with fluid 2313. Lower transparent conductive electrode 2317 has been built up on the device substrate 2301 such that each sub-pixel area of electrode 2317 has a depression 2322 that is registered to the light emitting area of OLED portion 2321. Depression 2322 is filled with a second non-conductive or insulating fluid 2315. Fluid 2315 is immiscible with fluid 2313 and has a lower refractive index than fluid 2313. Fluids 2313 and 2315 are separated from electrode 2317 by insulating layer 2316. The wettability of the surface of layer 2316 by fluid 2315 and thus the contact angle of fluid 2315 on the surface of layer 231 is altered by the application of a voltage difference between electrodes 2314 and 2317. The curvature of the surface between fluids 2313 and 2315 is thus altered by the application of the voltage difference from the flat surface 2318 at zero voltage to the curved surface 2319 at maximum voltage. Varying deformations of surface 2318 can be achieved at intermediate voltage differentials. It can be seen that with the application of a voltage difference between the electrodes the shape of fluid layer 2313 becomes that of a concave lens while the shape of fluid layer 2315 becomes that of a convex lens. Since layer 2313 has a higher refractive index than layer 2315, the lens doublet formed by the two layers has negative optical power and when voltage is applied light from OLED portion 2321 is diverged.

The properties of chiral OLED devices such as 2027 in FIG. 20 that make them useful for applications like embodiments 2000, 2200 and 2300 depicted in FIGS. 20, 22 and 23 are their vertical emission of light that is well-collimated, their emission of light in narrow spectral wavelength bands, and their emission of polarized light. However, in the case of embodiment 2300 the narrow spectral band emission and the emission of polarized light, while they may be desirable, are not required. Thus, other vertically emitting OLED technologies such as those described in patent applications PCT/US2016/038,479 and U.S. application Ser. No. 10/434, 941 may also be used in place of OLED device 2321 in embodiment 2300.

What is claimed is:

1. A device comprising:
an array of electronically switchable light emitting sub-pixels wherein each light emitting sub-pixel includes:
a vertically-emitting organic light emitting diode that emits collimated light, and wherein the vertically-emitting organic light emitting diode emits light by stimulated emission; and
a variable focus device that overlays the vertically-emitting organic light emitting diode.

2. The device of claim 1, wherein said vertically emitting organic light emitting diode further includes:
a first hole transporting layer comprising a polymerized chiral nematic liquid crystal material that is doped with a p-dopant;
a second hole transporting layer comprising a polymerized chiral nematic liquid crystal layer; and
a light emitting layer that includes:
a polymerized chiral nematic liquid crystalline material; an electroluminescent material;
a first electron transporting layer comprising a polymerized chiral nematic liquid crystalline material; and
a second electron transporting layer comprising a polymerized liquid crystalline material that is doped with an n-dopant.

3. The device of claim 1, wherein said vertically emitting organic light emitting diode further includes:
a light emitting photonic crystal having emitter material disposed within the photonic crystal.

4. The device of claim 1, wherein said vertically emitting organic light emitting diode further includes:
a light emitting photonic crystal having a band-gap, the light emitting photonic crystal further including:
a plurality of alternating layers of high index of refraction dielectric materials and low index of refraction dielectric materials, the plurality of alternating layers together producing a periodically varying refractive index; and an organic light emitting diode capable of emitting light at an edge of the band-gap and at a wavelength greater than one-half peak power of an emission spectrum of said vertically emitting light emitting diode.

5. The device of claim 1, wherein said vertically emitting organic light emitting diode further includes:

a first feedback layer adapted to receive and reflect light;

a second feedback layer adapted to receive and reflect light, wherein at least one said first feedback layer and said second feedback layer has a refractive index profile that at least in part varies periodically and continuously along an axis substantially normal to a plane of a respective feedback layer; and an emissive layer disposed between said first feedback layer and said second feedback layer.

6. The device of claim 1, wherein the vertically emitting light emitting diode further includes:

a first reflector;

a second reflector; and a luminescent material disposed between said first and said second reflectors, wherein said luminescent material comprises a defect in a continuous photonic crystal formed by said first reflector and said second reflector.

7. The device of claim 1, wherein said variably focus device is an electrically switchable liquid crystal lens.

8. The device of claim 7, wherein said electrically switchable liquid crystal lens is a diffractive lens.

9. The device of claim 7, wherein said electrically switchable liquid crystal lens is a refractive lens.

10. The device of claim 1, wherein said variably focus device is an electrically switchable electrowetting lens device.

11. A device for use as a display, the display providing to a subject viewing the display an apparent depth of focus, the device comprising:

an array of electronically switchable light emitting sub-pixels wherein each light emitting sub-pixel includes:

a vertically-emitting organic light emitting diode that emits collimated light, and wherein the vertically-emitting organic light emitting diode emits light by stimulated emission; and a variable focus device that overlays the vertically-emitting organic light emitting diode, the variable focus device providing the apparent depth for each sub-pixel.

12. The device of claim 11, wherein the display comprising the array of sub-pixels is a dot-matrix graphic display providing the apparent depth of focus to the subjecting viewing the display.

13. The device of claim 12 wherein each vertically emitting organic light emitting diode further includes:

a first hole transporting layer comprising a polymerized chiral nematic liquid crystal material that is doped with a p-dopant;

a second hole transporting layer comprising a polymerized chiral nematic liquid crystal layer; and a light emitting layer that includes:

a polymerized chiral nematic liquid crystalline material; an electroluminescent material;

a first electron transporting layer comprising a polymerized chiral nematic liquid crystalline material; and a second electron transporting layer comprising a polymerized liquid crystalline material that is doped with an n-dopant.

14. The device of claim 12, wherein said vertically emitting organic light emitting diode further includes:

a light emitting photonic crystal having emitter material disposed within the photonic crystal.

15. The device of claim 12, wherein each vertically emitting organic light emitting diode further includes:

a light emitting photonic crystal having a band-gap, the light emitting photonic crystal further including:

a plurality of alternating layers of high index of refraction dielectric materials and low index of refraction dielectric materials, the plurality of alternating layers together producing a periodically varying refractive index; and an organic light emitting diode capable of emitting light at an edge of the band-gap and at a wavelength greater than one-half peak power of an emission spectrum of said vertically emitting light emitting diode.

16. The device of claim 12, wherein each vertically emitting organic light emitting diode further includes:

a first feedback layer adapted to receive and reflect light;

a second feedback layer adapted to receive and reflect light, wherein at least one said first feedback layer and said second feedback layer has a refractive index profile that at least in part varies periodically and continuously along an axis substantially normal to a plane of a respective feedback layer; and an emissive layer disposed between said first feedback layer and said second feedback layer.

17. The device of claim 12, wherein each vertically emitting light emitting diode further includes:

a first reflector;

a second reflector; and a luminescent material disposed between said first and said second reflectors, wherein said luminescent material comprises a defect in a continuous photonic crystal formed by said first reflector and said second reflector.

18. The device of claim 12, wherein said variable focus device is an electrically switchable liquid crystal lens.

19. The device of claim 18, wherein said electrically switchable liquid crystal lens is a diffractive lens.

20. The device of claim 18, wherein said electrically switchable liquid crystal lens is a refractive lens.

* * * * *